United States Patent
Mokhlesi et al.

(10) Patent No.: US 8,837,216 B2
(45) Date of Patent: Sep. 16, 2014

(54) NON-VOLATILE STORAGE SYSTEM WITH SHARED BIT LINES CONNECTED TO A SINGLE SELECTION DEVICE

(75) Inventors: Nima Mokhlesi, Los Gatos, CA (US); Mohan V. Dunga, Santa Clara, CA (US); Masaaki Higashitani, Cupertino, CA (US)

(73) Assignee: Sandisk Technologies Inc., Plano, TX (US)

( * ) Notice: Subject to any disclaimer, the term of this patent is extended or adjusted under 35 U.S.C. 154(b) by 409 days.

(21) Appl. No.: 13/107,686

(22) Filed: May 13, 2011

(65) Prior Publication Data

US 2012/0147676 A1    Jun. 14, 2012

Related U.S. Application Data

(60) Provisional application No. 61/422,385, filed on Dec. 13, 2010.

(51) Int. Cl.
*G11C 16/04* (2006.01)
*H01L 21/28* (2006.01)
*H01L 27/115* (2006.01)

(52) U.S. Cl.
CPC .... *H01L 21/28273* (2013.01); *H01L 27/11519* (2013.01); *H01L 27/11521* (2013.01); *G11C 16/0483* (2013.01)
USPC ............. 365/185.05; 365/185.1; 365/185.13; 365/185.11; 365/185.17; 257/315

(58) Field of Classification Search
USPC ............... 365/185.02, 185.1, 185.12, 185.13, 365/185.11, 185.17, 185.05; 257/315, 314
See application file for complete search history.

(56) References Cited

U.S. PATENT DOCUMENTS

| 6,028,788 | A | 2/2000 | Choi |
| 6,091,633 | A | 7/2000 | Cernea |
| 6,151,249 | A | 11/2000 | Shirota |
| 6,480,422 | B1 | 11/2002 | Wong |
| 6,620,683 | B1 | 9/2003 | Lin |
| 7,169,624 | B2 | 1/2007 | Hsu |
| 7,237,074 | B2 | 6/2007 | Guterman |
| 7,244,984 | B2 | 7/2007 | Kamigaichi |
| 7,508,714 | B2 | 3/2009 | Fasoli |

(Continued)

FOREIGN PATENT DOCUMENTS

DE    10 2007 033017    11/2008

OTHER PUBLICATIONS

Shin, et al., "A New Shared Bit Line NAND Cell Technology for the 256Mb Flash Memory with 12V Programming,"Samsung Electronics Co., Ltd., Korea, 1996 IEEE.

(Continued)

*Primary Examiner* — Andrew Q Tran
(74) *Attorney, Agent, or Firm* — Vierra Magen Marcus LLP

(57) ABSTRACT

A non-volatile storage system is disclosed that includes pairs of NAND strings (or other groupings of memory cells) in the same block being connected to and sharing a common bit line. To operate the system, two selection lines are used so that the NAND strings (or other groupings of memory cells) sharing a bit line can be selected at the block level. Both selection lines are connected to a selection gate for each of the NAND strings (or other groupings of memory cells) sharing the bit line.

25 Claims, 30 Drawing Sheets

(56) References Cited

U.S. PATENT DOCUMENTS

| | | | |
|---|---|---|---|
| 7,691,710 B2 * | 4/2010 | Mokhlesi et al. | 438/266 |
| 8,208,301 B2 * | 6/2012 | Kang et al. | 365/185.05 |
| 2008/0090351 A1 | 4/2008 | Mokhlesi | |
| 2009/0302472 A1 | 12/2009 | Yoon | |

OTHER PUBLICATIONS

International Search Report dated Jan. 28, 2013, PCT Patent Application No. PCT/2011/056146.

Written Opinion of the International Searching Authority dated Jan. 28, 2013, PCT Patent Application No. PCT/2011/056146.

* cited by examiner

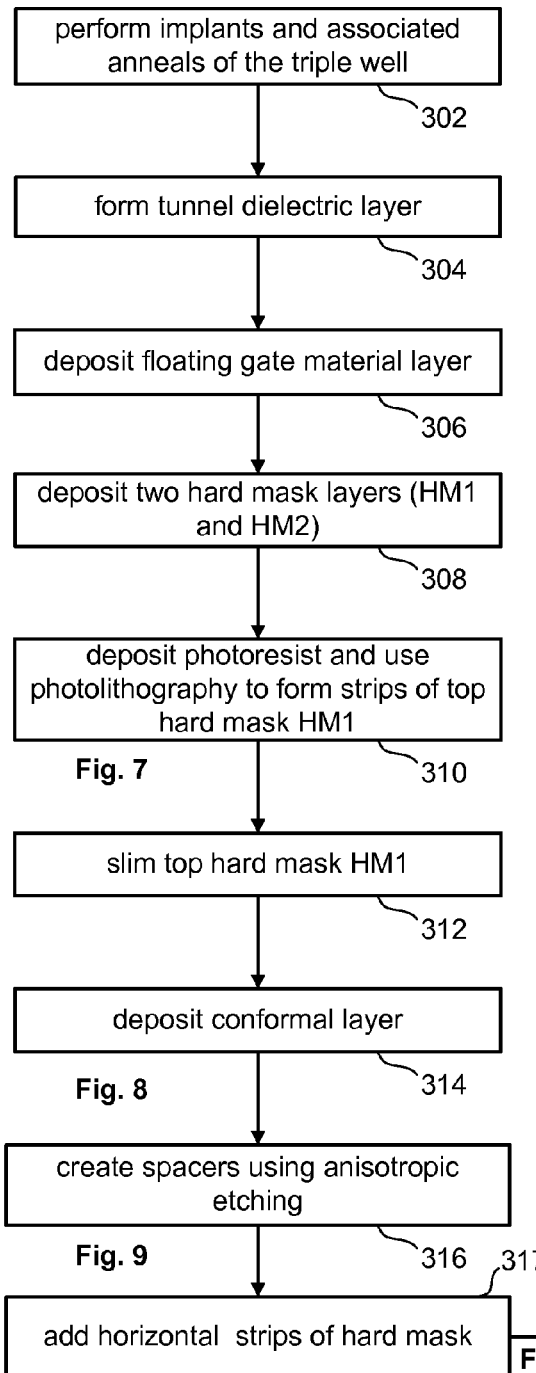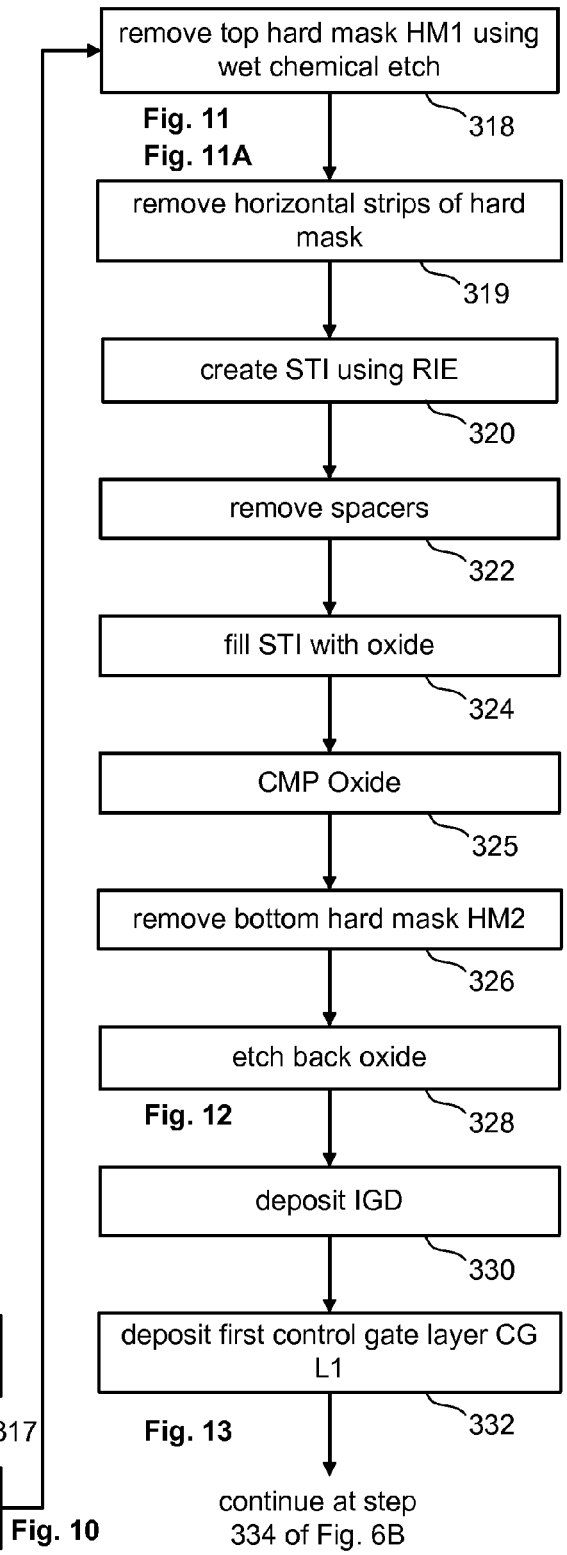

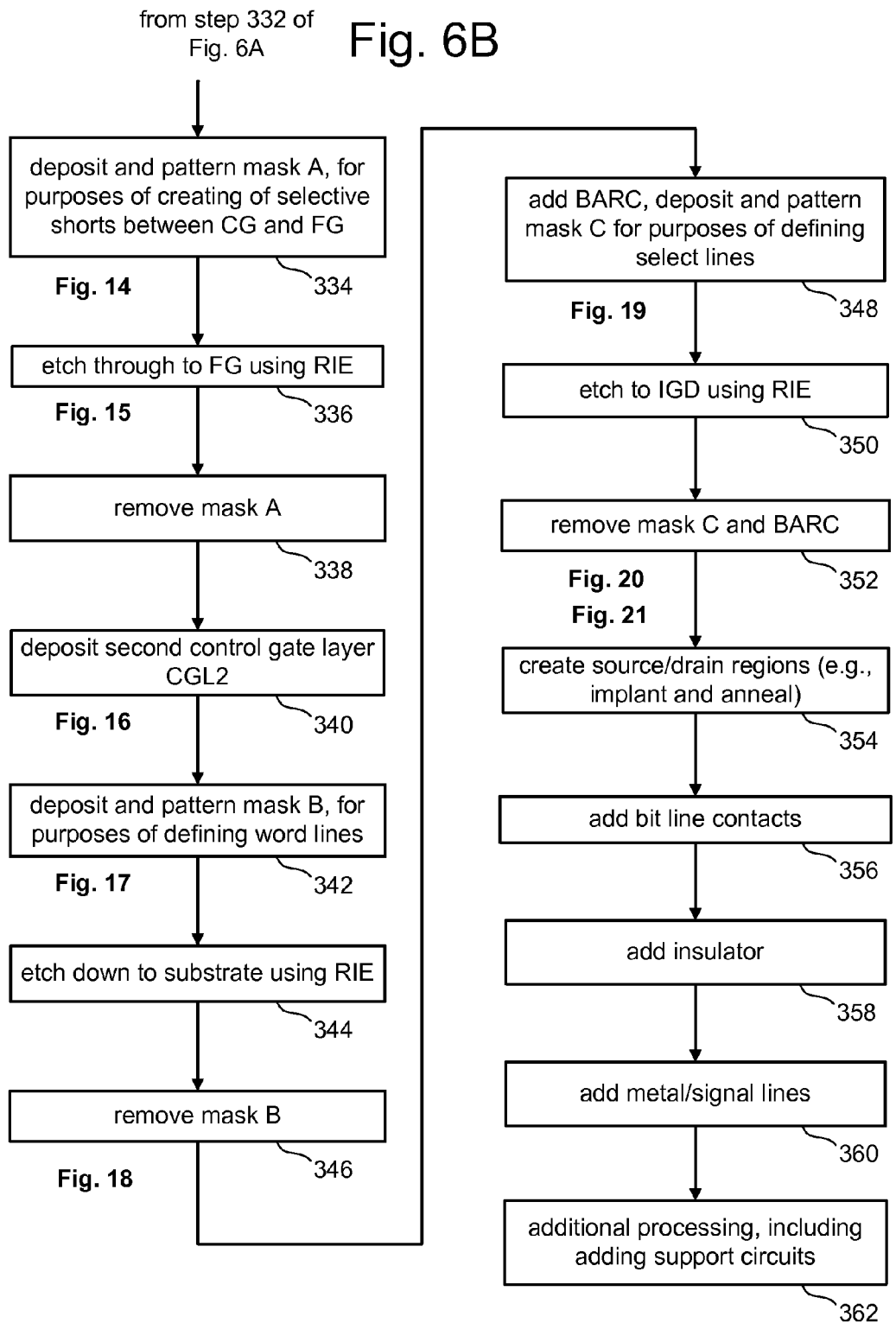

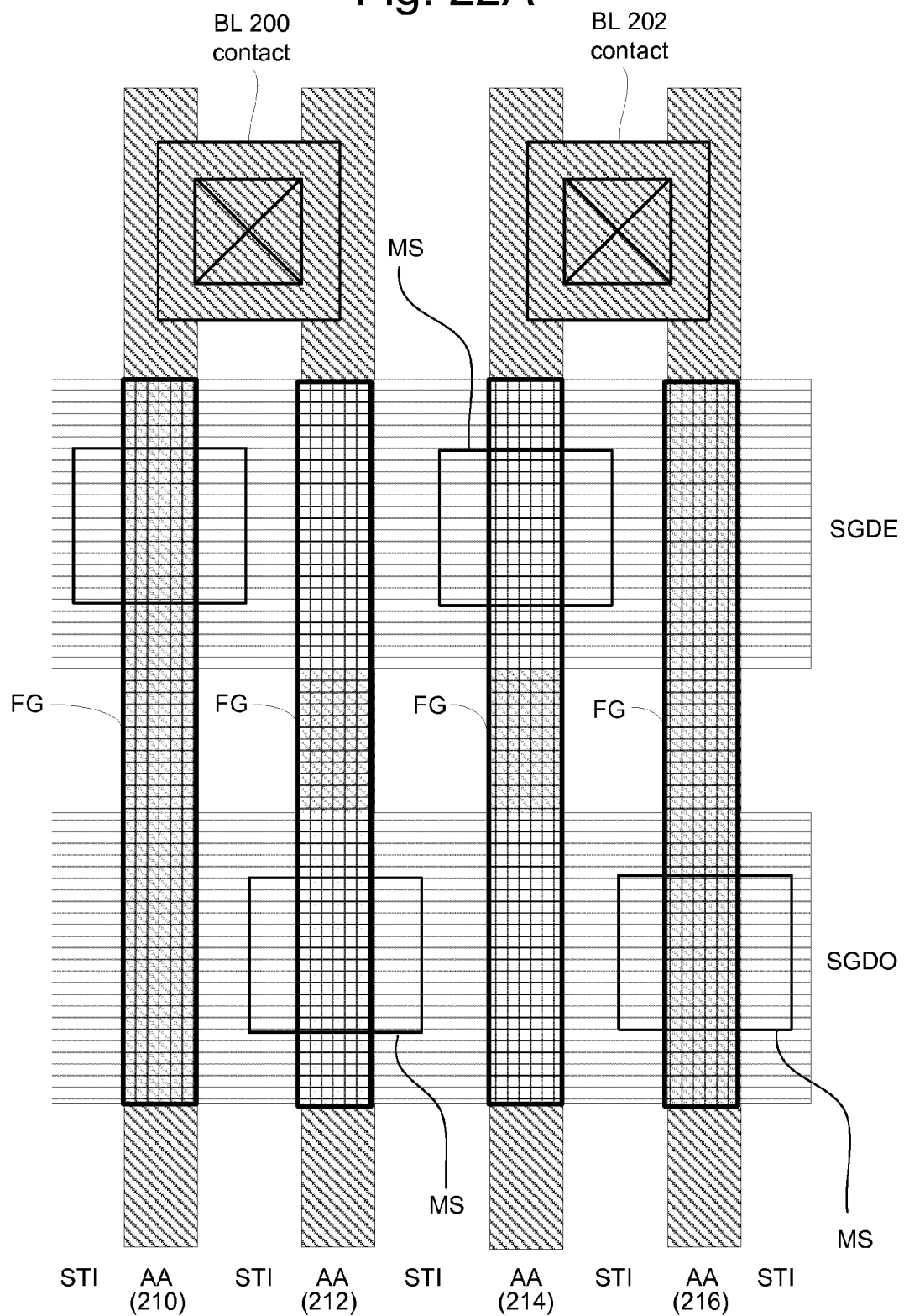

Etch back everywhere including SGD region

Etch back everywhere excluding SGD region

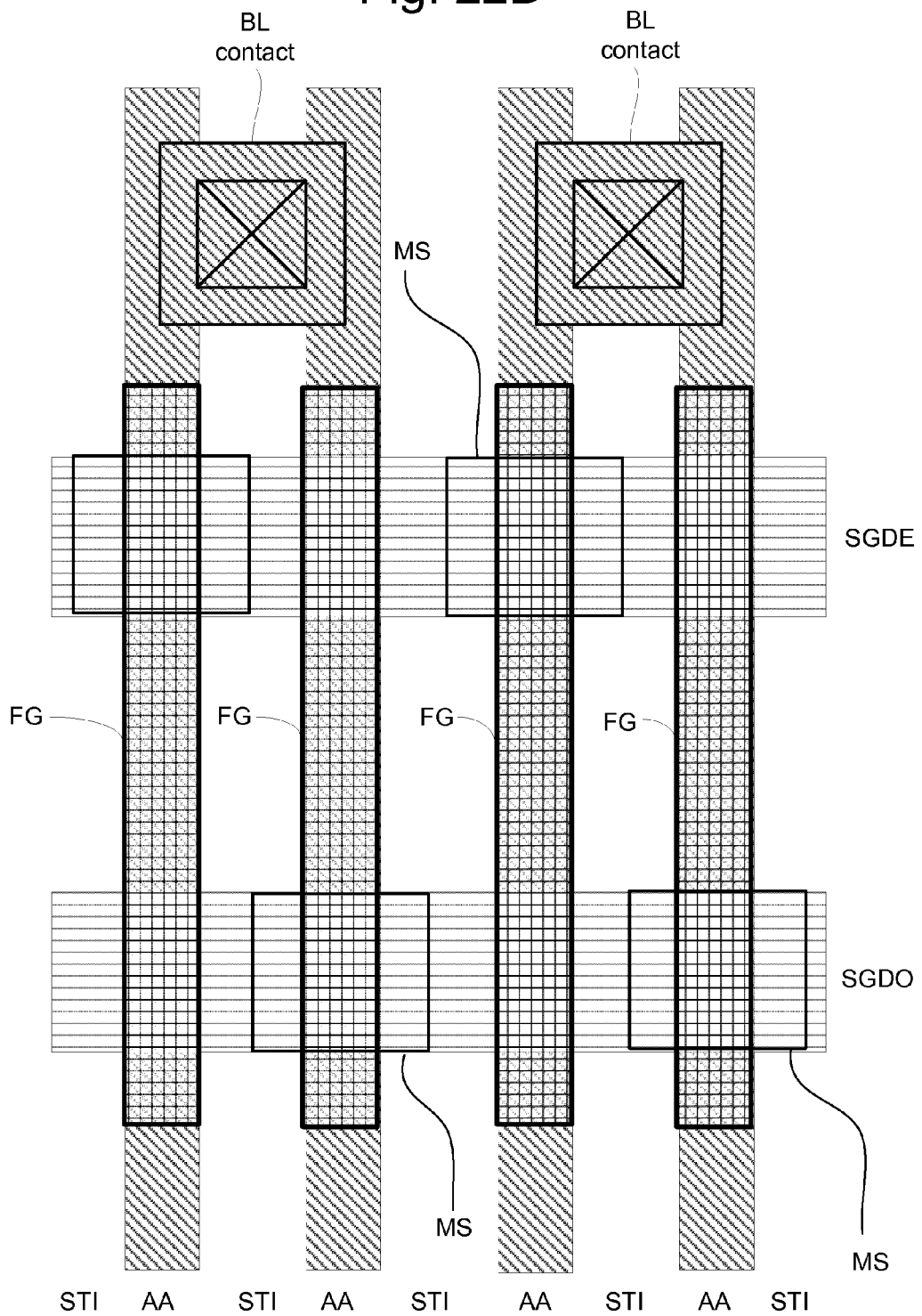

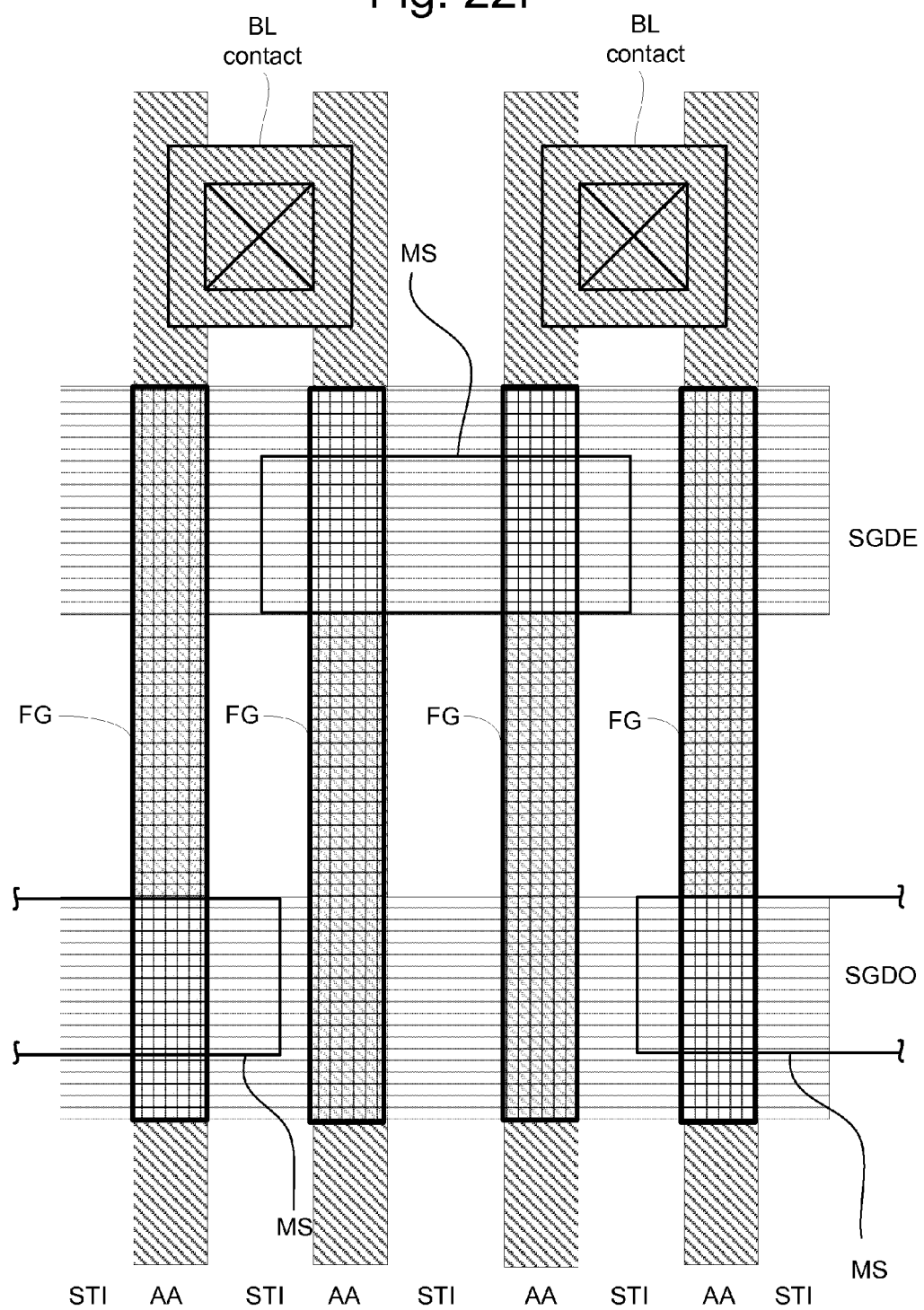

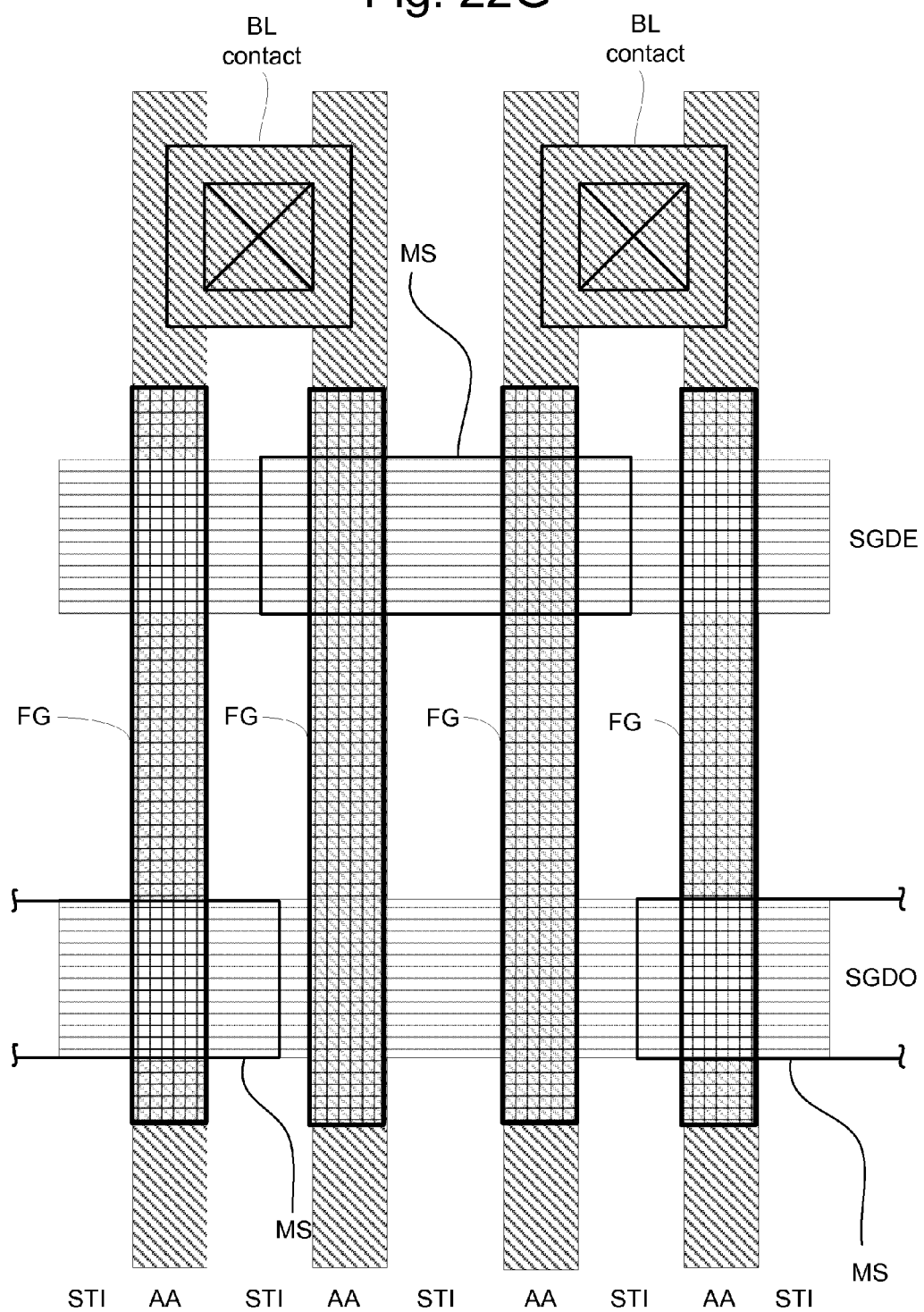

Fig. 24

|        | T1 | T2    | T3    | T4    | T5    | T6 |
|--------|----|-------|-------|-------|-------|----|
| BL200  | 0  | Vdd   | Vdd   | 0     | 0     | 0  |
| BL202  | 0  | Vdd   | Vdd   | Vdd   | Vdd   | 0  |
|        |    |       |       |       |       |    |
| SGDE   | 0  | Vdd   | Vdd   | Vsgd  | Vsgd  | 0  |
| SGDO   | 0  | Vdd   | 0     | 0     | 0     | 0  |
|        |    |       |       |       |       |    |
| WLn=2  | 0  | Vpass | Vpass | Vpass | Vpgm  | 0  |
| WLn ≠2 | 0  | Vpass | Vpass | Vpass | Vpass | 0  |
|        |    |       |       |       |       |    |
| SGS    | 0  | 0     | 0     | 0     | 0     | 0  |

Fig. 25

|        | T1 | T2     | T3     | T4    | T5    | T6 |
|--------|----|--------|--------|-------|-------|----|
| BL200  | 0  | Vdd    | 0      | 0     | 0     | 0  |
| BL202  | 0  | Vdd    | Vdd    | Vdd   | Vdd   | 0  |
|        |    |        |        |       |       |    |
| SGDE   | 0  | Vdd    | Vdd    | Vsgd  | Vsgd  | 0  |
| SGDO   | 0  | Vdd    | 0      | 0     | 0     | 0  |
|        |    |        |        |       |       |    |
| WLn=2  | 0  | 0V (V1)| 0V (V1)| Vpass | Vpgm  | 0  |
| WLn ≠2 | 0  | 0V (V1)| 0V (V1)| Vpass | Vpass | 0  |
|        |    |        |        |       |       |    |
| SGS    | 0  | 0      | 0      | 0     | 0     | 0  |

Fig. 26

|        | T1 | T2     | T3     | T4    | T5    | T6 |
|--------|----|--------|--------|-------|-------|----|
| BL200  | 0  | Vdd    | 0      | 0     | 0     | 0  |
| BL202  | 0  | Vdd    | Vdd    | Vdd   | Vdd   | 0  |
|        |    |        |        |       |       |    |
| SGDE   | 0  | 0      | Vdd    | Vsgd  | Vsgd  | 0  |
| SGDO   | 0  | Vdd    | 0      | 0     | 0     | 0  |
|        |    |        |        |       |       |    |
| WLn=2  | 0  | 0V (V1)| 0V (V1)| Vpass | Vpgm  | 0  |
| WLn ≠2 | 0  | 0V (V1)| 0V (V1)| Vpass | Vpass | 0  |
|        |    |        |        |       |       |    |
| SGS    | 0  | 0      | 0      | 0     | 0     | 0  | ically a program voltage is applied to the control gate and
NON-VOLATILE STORAGE SYSTEM WITH SHARED BIT LINES CONNECTED TO A SINGLE SELECTION DEVICE This application claims priority to U.S. Provisional Application 61/422,385, filed on Dec. 13, 2010, incorporated herein by reference in its entirety.

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states: an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

To increase the capacity of non-volatile storage systems and/or reduced the size of the systems, there has been a trend to shrink the area needed to implement the memory structure.

BRIEF DESCRIPTION OF THE DRAWINGS

FIGS. 6A-6B depict a flow chart describing one embodiment of a portion of a process for fabricating a non-volatile storage system.
FIGS. 22A, 22B and 22D-22G depict a top view of the select gates for various embodiments of the technology described herein.
FIG. 24 is a table that shows various voltages used for one embodiment of a process for programming a non-volatile storage system that uses the technology described herein.
FIG. 25 is a table that shows various voltages used for one embodiment of a process for programming a non-volatile storage system that uses the technology described herein.
FIG. 26 is a table that shows various voltages used for one embodiment of a process for programming a non-volatile storage system that uses the technology described herein.

DETAILED DESCRIPTION

A non-volatile storage system is disclosed that includes pairs of NAND strings (or other groupings of memory cells) in the same block being connected to and sharing a common bit line. By sharing bit lines, less bit lines are needed in the storage system. Using less bit lines reduces the space needed to implement the storage system. To operate the system, two selection lines are used so that the NAND strings (or other groupings of memory cells) sharing a bit line can be selected at the block level. Both selection lines are physically connected, but only one of the selection lines is electrically connected, to a single selection gate for each of the NAND strings (or other groupings of memory cells) sharing the bit line.

Figure 1:
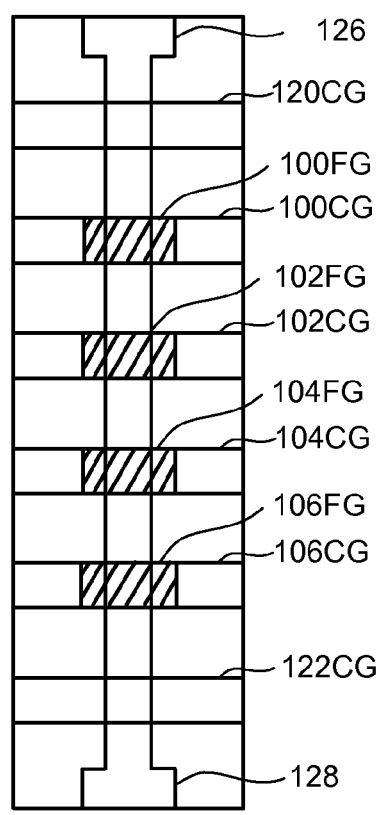
FIG. 1 is a top view of a NAND string.
Figure 2:
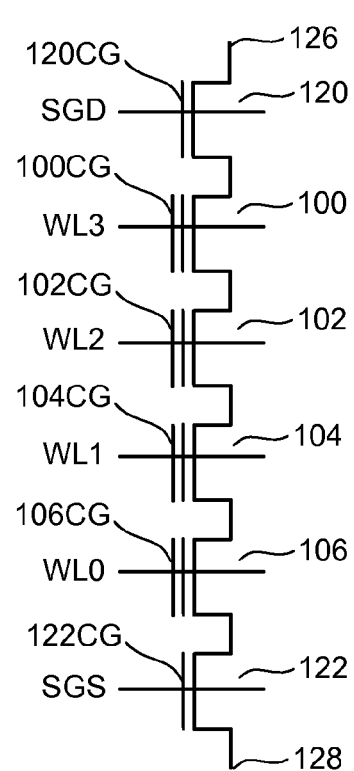
FIG. 2 is an equivalent circuit diagram of the NAND string.

One example of a non-volatile storage system that can be used to implement the technology described herein is a flash memory system that uses the NAND structure, which includes arranging multiple transistors in series, sandwiched between two select gates. The transistors in series and the select gates are referred to as a NAND string. FIG. 1 is a top view showing one prior art NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. The use of the terms connect, connected, and connection in this document can include a direct connection or an indirect connection. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348.

Other types of non-volatile storage devices, in addition to NAND flash memory, can also be used.

Figure 3:
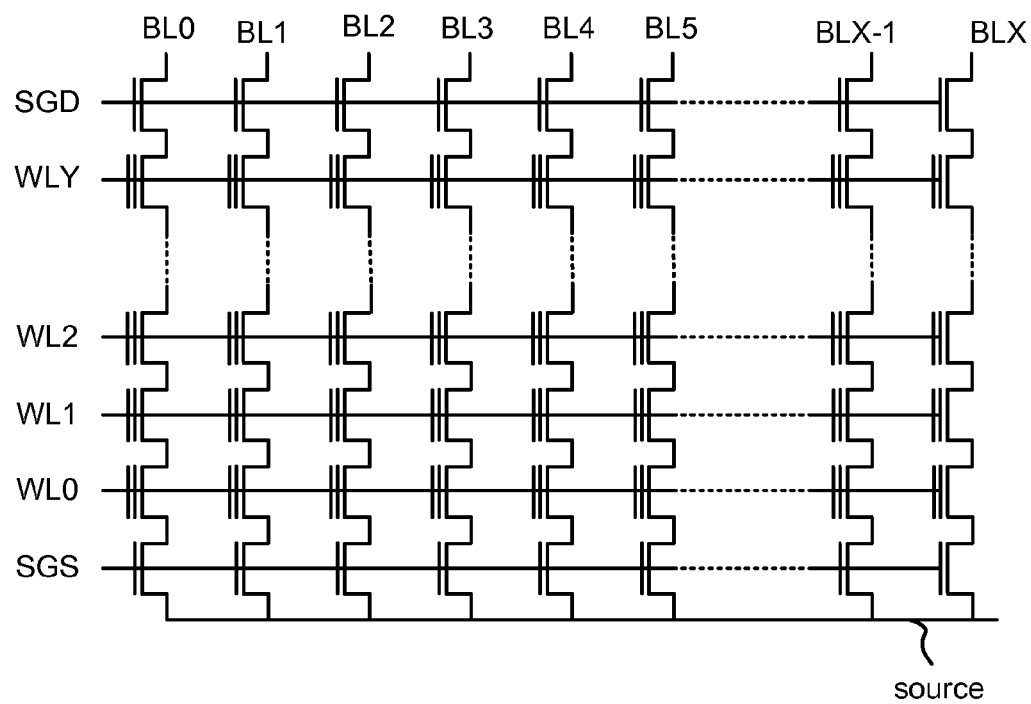
FIG. 3 is a block diagram depicting one embodiment of a block in a prior art memory array.

FIG. 3 provides one example of a block of memory cells implemented in prior art memory systems. As can be seen, each NAND string includes many memory cells. For example FIG. 3 shows each NAND string including Y memory cells. Each NAND string is connected to one bit line. There is one drain side selection signal SGD and one source side selection signal SGS.

In order to save space on the semiconductor die, it is proposed that two NAND strings (or other grouping in memory cells) share a single bit line. One proposal for having two NAND strings share a bit line includes using two select gates at the drain side (same end) of each NAND string in order to connect or disconnect a NAND string from a bit line. For example, looking at FIG. 3, the signal SGD would be replaced by two signals SGD1 and SGD2. Each NAND string would then have two drain side select gates, each connected to a different drain side selection signal. One of the two drain side select gates for each NAND string would be a depletion mode transistor with its threshold voltage lower than 0 volts. One problem with using two select gates on the drain side of each NAND string is that two drain side select gates (as compared to one drain side select transistor) require more area on the die. Therefore, the technology described herein proposes to only use one drain side selection gate for each NAND string, with two drain side selection signals.

Figure 4:
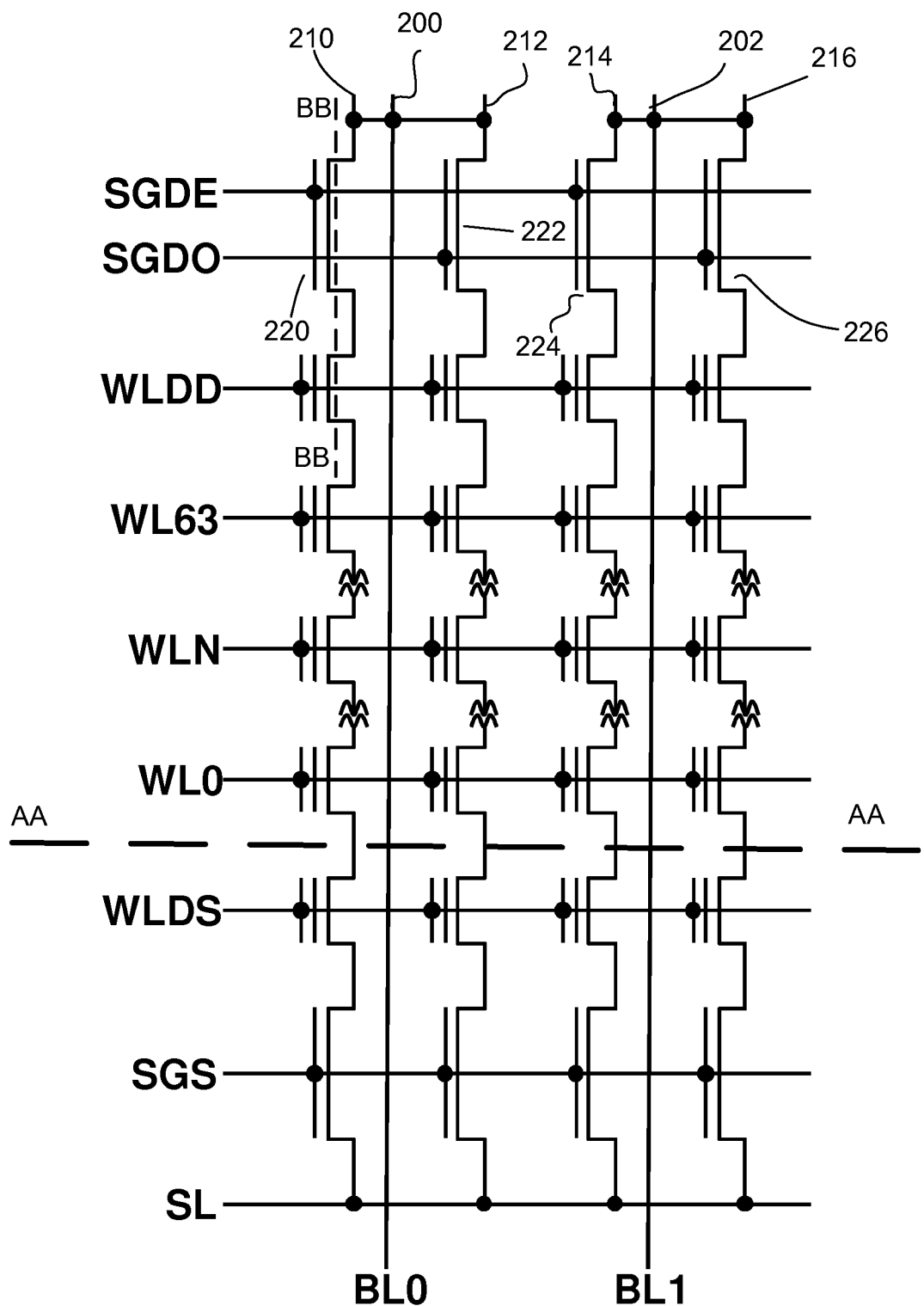
FIG. 4 is a block diagram depicting one embodiment of a portion of a memory array according to the technology described herein.

FIG. 4 is a portion of a first embodiment of a memory system for which a bit line is shared between two NAND strings, where each NAND string includes only one drain side selection gate and the block includes two drain side selection signals. For example, FIG. 4 shows four NAND strings from a block of NAND strings. Each NAND string includes 64 data memory cells (WL0 . . . WL63) with one or more dummy memory cells on each side of the data memory cells. In other embodiments, more or less than 64 data memory cells can be included on a NAND string. The block of memory cells will include two drain side selection signals SGDE and SGDO. FIG. 4 shows two bit lines 200 and 202. Bit line 200 is connected to NAND string 210 and NAND string 212. Bit line 202 is connected to NAND string 214 and NAND string 216. The drain side selection signal SGDE is used to select or unselect NAND string 210 and NAND string 214. The drain side signal SGDO is used to select NAND string 212 and NAND string 216. Each NAND string only includes one drain side selection gate, implemented as a single transistor. For example NAND string 210 includes drain side selection gate 220, NAND string 212 includes drain side selection gate 222, NAND string 214 includes drain side selection gate 224 and NAND string 216 includes drain side selection gate 226. Both selection signals SGDE and SGDO are physically connected to selection gate 220, selection gate 222, selection gate 224 and selection gate 226. Selection signal line SGDE is in electrical communication with selection gate 210 and selection gate 214, while being electrically insulated from selection gate 222 and selection gate 226. Similarly, signal line SGDO is in electrical communication with selection gate 222 and selection gate 226, and electrically insulated from selection gate 220 and selection gate 224. Additional implementation details are described below.

Figure 5:
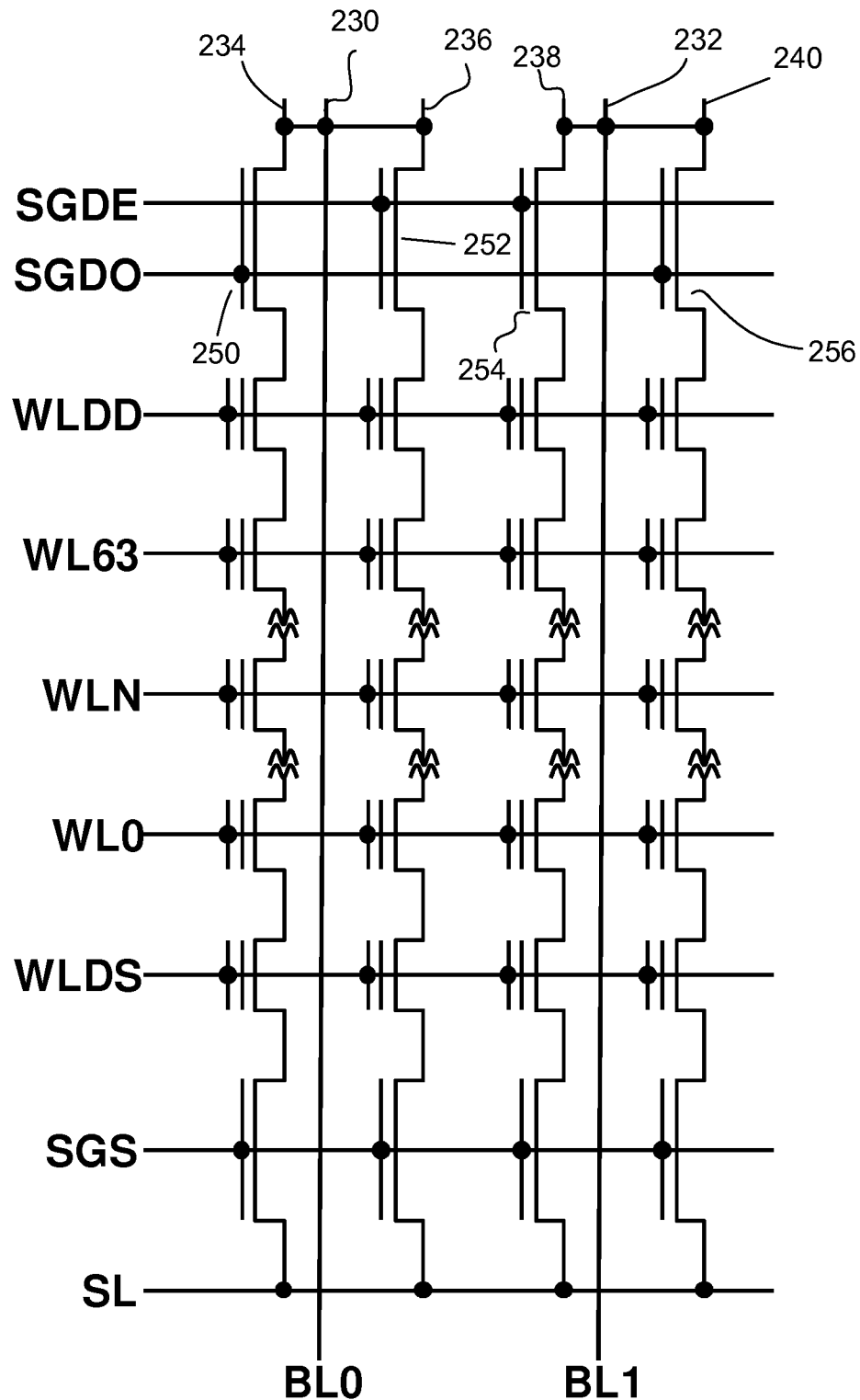
FIG. 5 is a block diagram depicting one embodiment of a portion of a memory array according to the technology described herein.

FIG. 5 provides another embodiment for sharing a bit line between two NAND strings. FIG. 5 shows bit lines 230 and 232. Bit line 230 is connected to and shared by NAND string 234 and NAND string 236. Bit line 232 is connected to and shared by NAND string 238 and NAND string 240. FIG. 5 shows selection signal lines SGDE and SGDO physically connected to the selection gates 250, 252, 254 and 256. Selection signal line SGDE is in electrical communication with selection gate 252 and selection gate 254, while being electrically insulated from selection gate 250 and selection gate 256. Selection signal line SGDO is in electrical communication with selection gate 250 and selection gate 256, while being electrically insulated from selection gate 252 and selection gate 254. A difference between the embodiments of FIG. 4 and FIG. 5 is that the embodiment of FIG. 4 alternates such that every other NAND string has its selection gate electrically in electric communication with the same selection signal line while the embodiment of FIG. 5 has adjacent pairs of NAND strings in electric communication with the same selection signal line.

FIG. 6A and FIG. 6B depict a flowchart which describes a portion of one embodiment of a process fabricating a non-volatile storage system using the technology described herein. For ease of discussion, the process of FIG. 6A and 6B will be described in relation to the embodiment of FIG. 4. However, it will be clear to one of ordinary skill in the art that the process also applies to the embodiment of FIG. 5. FIGS. 7-21 depict a portion of a memory system in various stages of the fabrication process of FIGS. 6A-6B and will be referred to during the discussion of FIGS. 6A-B. FIGS. 7, 8, 9, 11, 12 and 13 depict a cross section taken along dashed line AA of FIG.

Figure 10:
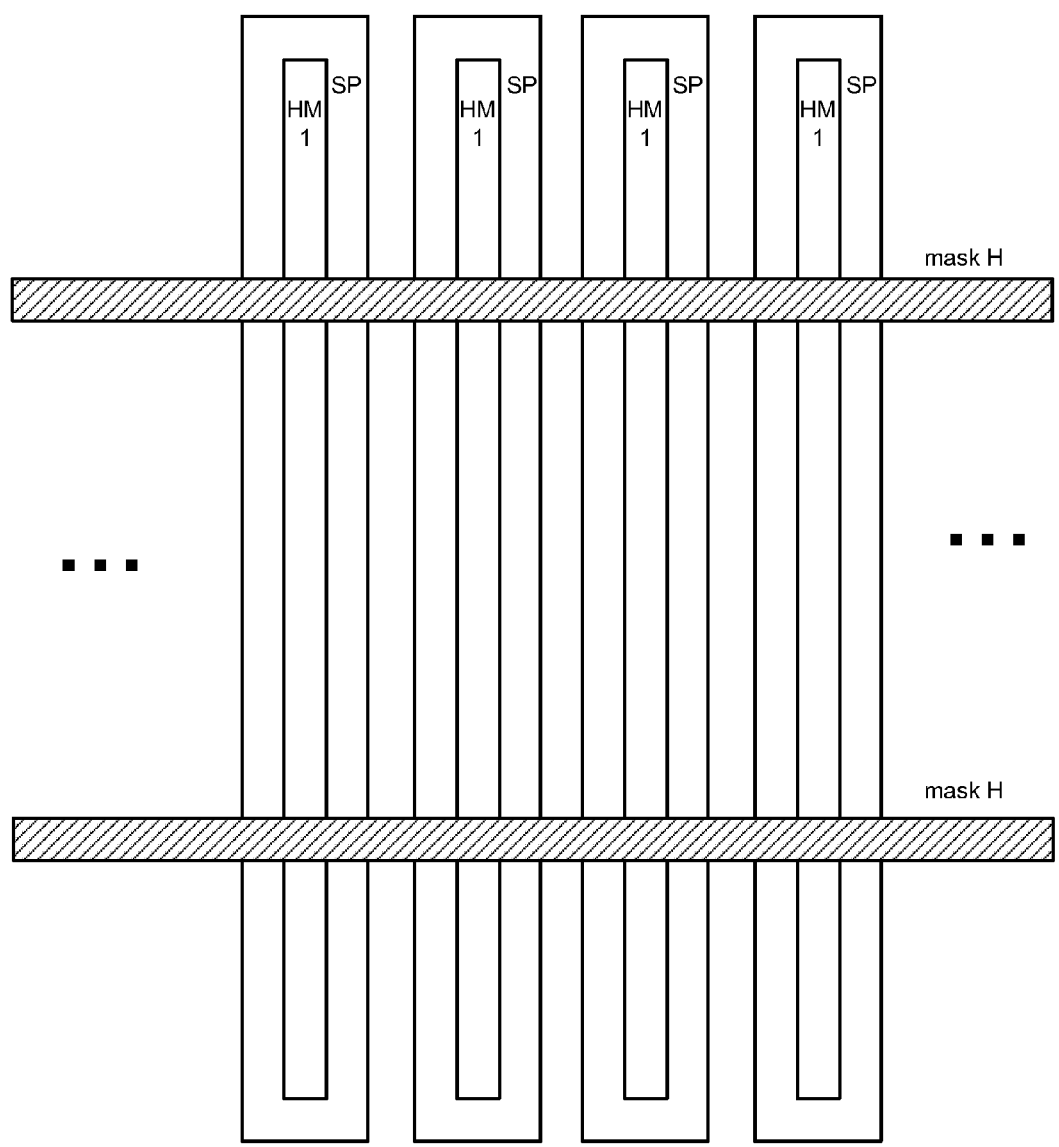

4. FIG. 10 provides a top view. FIGS. 14-21 depict a cross section taken along dashed line BB of FIG. 4.

Note that FIG. 6A and 6B are flowcharts describing only a portion of the front end process for manufacturing of non-volatile storage devices, which covers only steps only as far as forming some of the M1 metal layers. These flows do not cover all of the fabrication steps and one of ordinary skill in the art would understand the additional steps needed. There are many ways to manufacture memory according to the present invention and, thus, it is contemplated that various methods other than that described by FIGS. 6A and 6B can be used. While a flash memory chip will consist of both peripheral circuitry, which includes a variety of low, medium and high voltage transistors, and the core memory, the process steps of FIGS. 6A and 6B are only intended to describe in general terms a possible process recipe for the fabrication of a portion of the core memory array. Many known photolithography, etch, implant, diffusion, and oxidation steps that are intended for the fabrication of the peripheral transistors are omitted.

Figure 7:
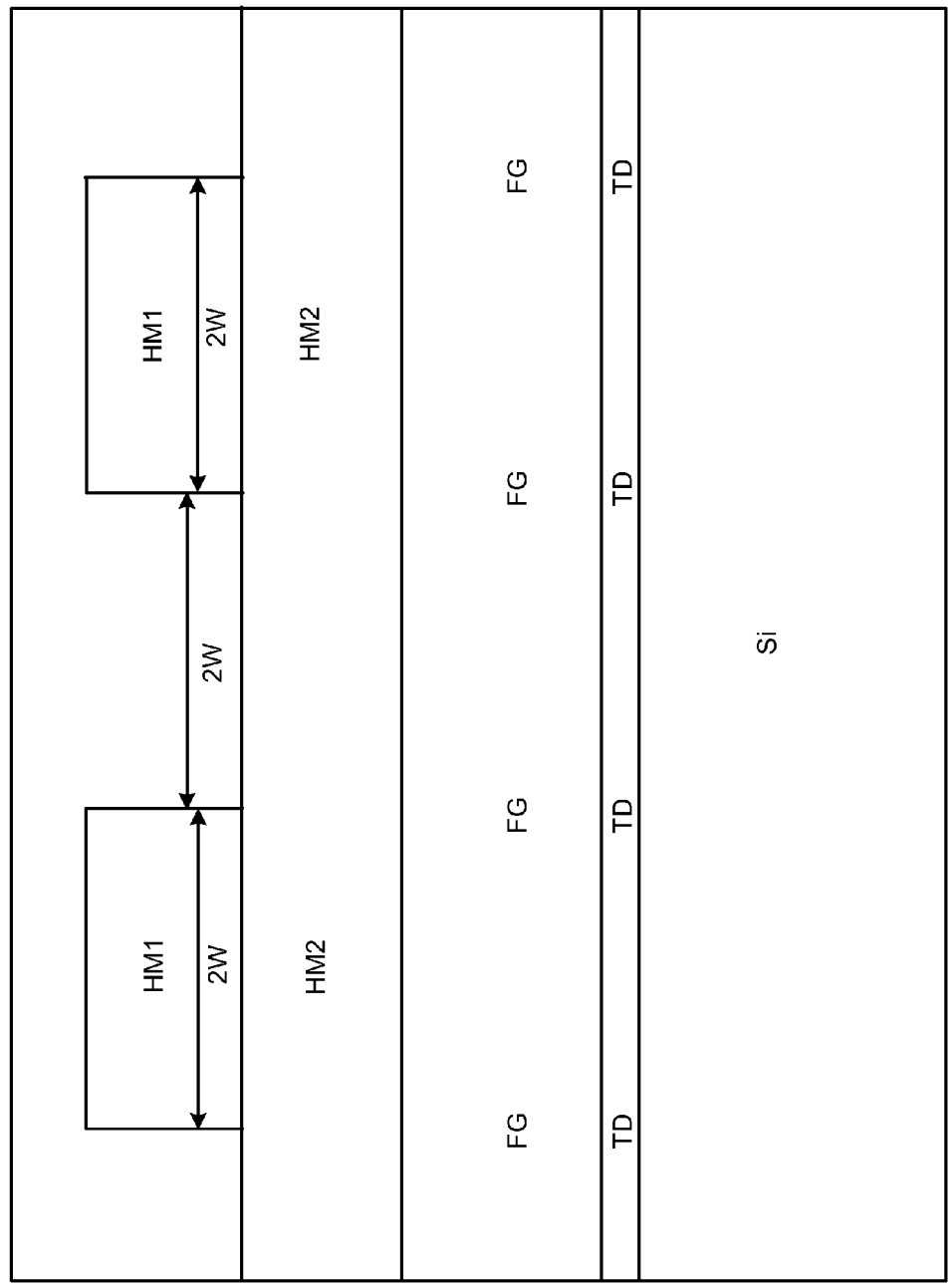
FIGS. 7-21 depicts a portion of a non-volatile storage system being fabricated according to the process of FIGS. 6A-6B.

Step 302 of FIG. 6A includes performing implants and associated anneals of the triple well. The result of step 302 includes a p-substrate, an n-well within the p-substrate and a p-well within the n-well. The n-well depth is typically much thicker than that of the p-well. The p-substrate is usually the thickest consisting of the majority of the wafer thickness. In step 304, a tunnel dielectric layer is deposited on top of the p-well. In one embodiment, the tunnel dielectric is made of $SiO_2$. In step 306, a floating gate layer is deposited over the dielectric layer using CVD, PVD, ALD, or another suitable method. In step 308, one or more hard mask layers (such as $SiO_2$, SiN, $SiO_xN_y$, and carbon oriented materials) are deposited using, for example, a CVD or Spin Coat process. In one embodiment, two hard masks (HM1 and HM2) are deposited over the floating gate layer. In one example implementation, the two hard mask layers include seven layers: (1) silicon on glass (SOG), (2) an Anti-Reflective Coating (ARC) that is organic below the SOG, (3) a high temperature oxide layer below the organic carbon layer, (4) a CVD oriented oxide [e.g., Tetra-ethyl oxide silicate (TEOS) or LP-CVD] layer below the a high temperature oxide, (5) a Silicon Nitride layer below the CVD oriented oxide layer, (6) another CVD oriented oxide layer below the Silicon Nitride layer and (7) another Silicon Nitride layer below the second CVD oriented oxide layer. The top four layers (1)-(4) comprise the top hard mask HM1 and the bottom three layers (5)-(7) comprise the botto, hard mask HM2. In other embodiments, other structures for one or more hard masks can also be used. In step 310, photoresist and photolithography are used to form strips of the top hard mask HM1 that was deposited in step 308. FIG. 7 shows the results after step 310. As can be seen, the silicon substrate area (Si) is depicted along with the tunnel dielectric layer TD, floating gate layer FG, bottom hard mask HM2 and the strips of top hard mask HM1. In this embodiment, the width of the strips of top hard mask HM1 are 2W. The spacing between top hard masks HM1 is also 2W.

Figure 8:
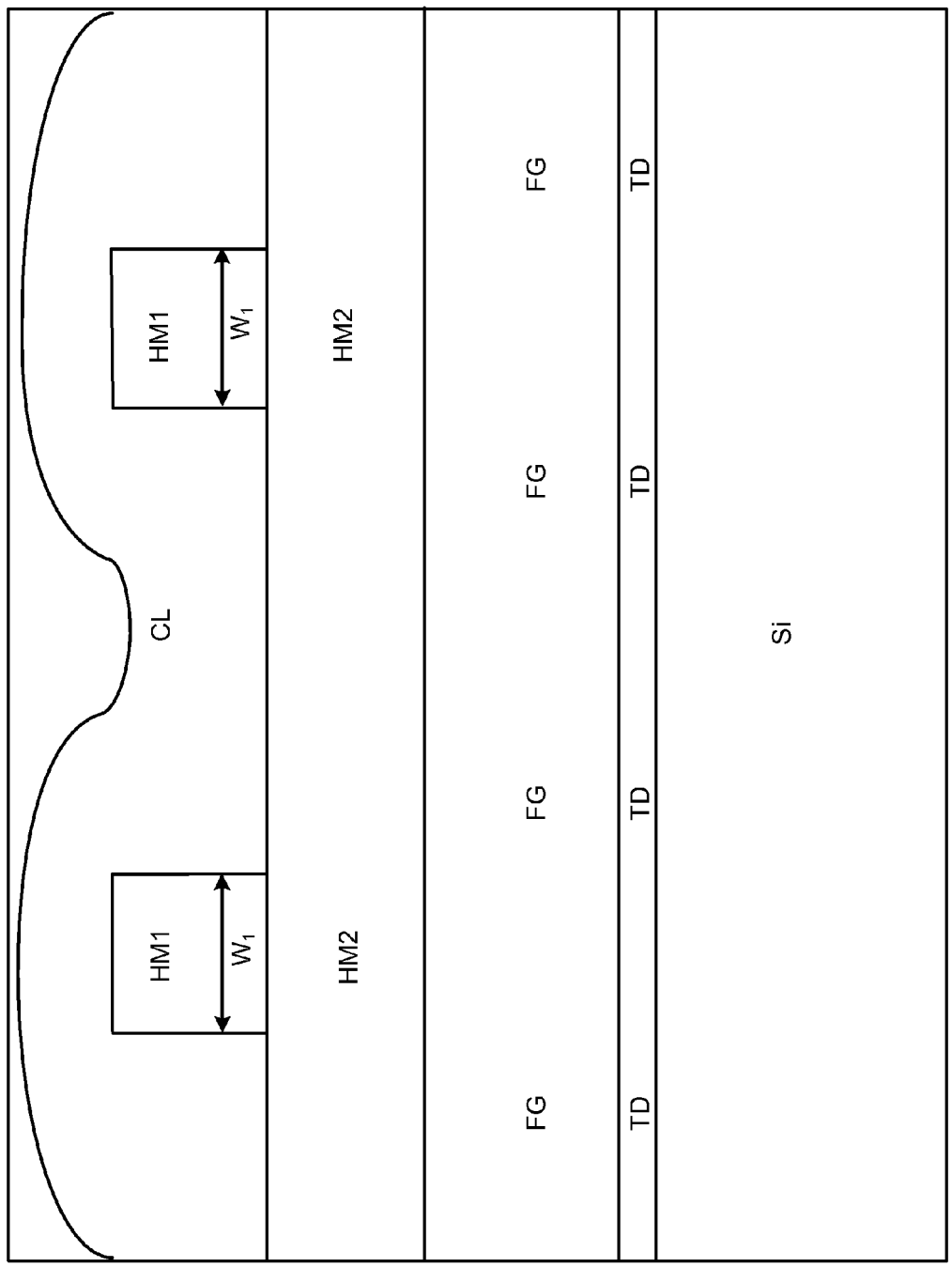

In step 312, a slimming process is performed to reduce the width of the top hard masks HM1 to a width of $W_1$. In some embodiments, $W_1$ is equal to W. In other embodiments, $W_1$ can be smaller or larger than W. In one embodiment the slimming process is performed using $O_2$. In step 314, a conformal layer is deposited on top of the floating gate layer FG and hard mask strips HM1. Based on etch selectivity to hard mask HM1 material, appropriate material can be picked for the conformal layer. FIG. 8 shows a portion of the memory system after step 314, depicting the hard mask HM reduced to a width of $W_1$ and the conformal layer CL deposited on top of the hard mask strips HM. At this point, the spacing between hard mask strips HM is $2W+(2W-W_1)$.

Figure 9:
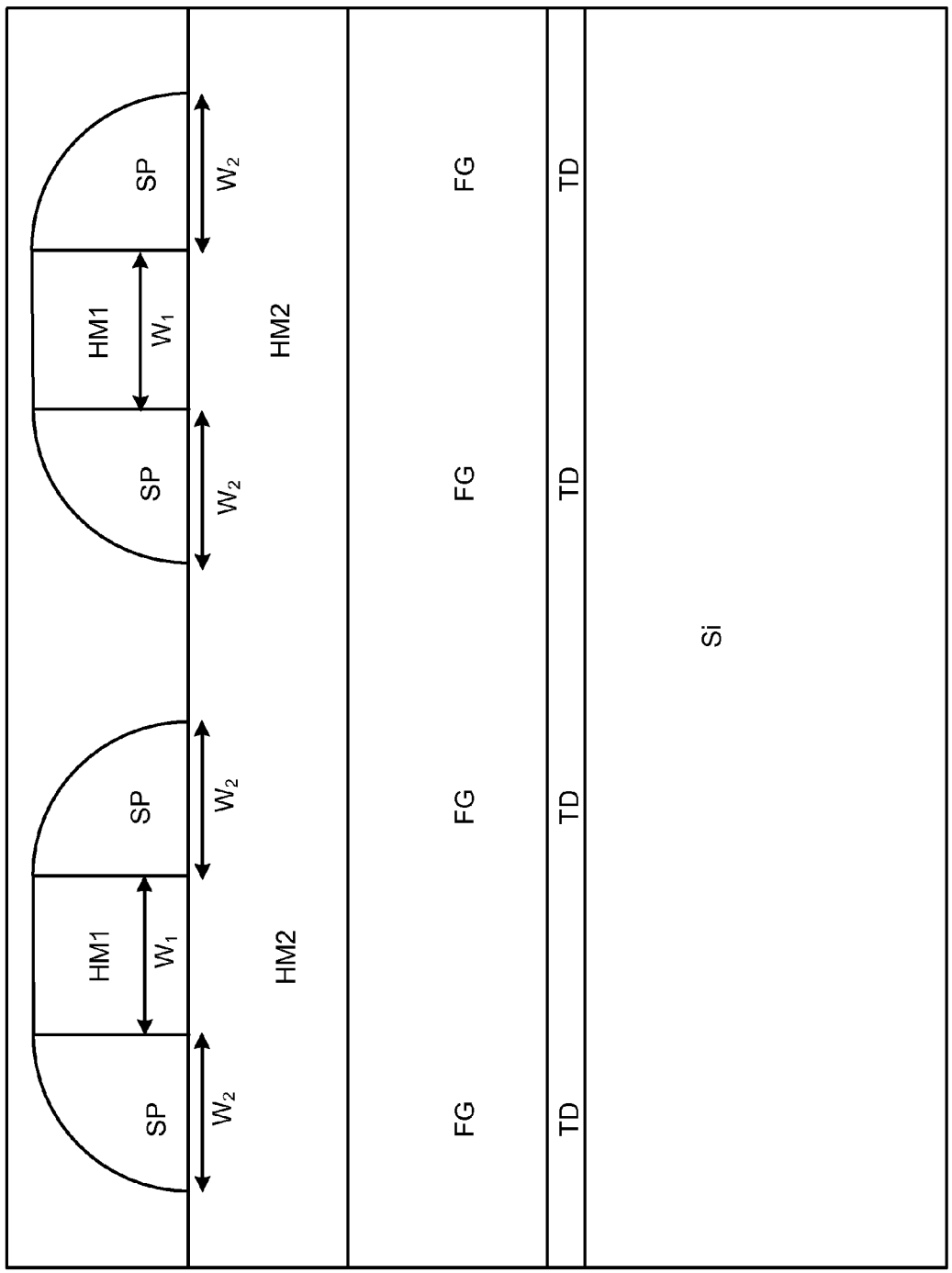

In step 316, spacers are created by performing anisotropic etching in a vertical direction only. The result of step 316 is depicted in FIG. 9, which shows each hard mask strip HM1 surrounded by spacers SP. The spacers 316 have a width of $W_2$. In one embodiment $W_2$ is wider than $W_1$, while in another embodiment $W_2$ is narrower than $W_1$. When the hard mask strips HM1 were formed, they were formed in continuous strips across the entire memory array. FIG. 10 is a top view of a portion of a memory array showing a plurality of hard mask strips HM1 surrounded by spacers SP. In step 317, horizontal strips of hard mask (mask H) are deposited across the hard mask strips HM1, as can be seen in FIG. 10. The areas where horizontal strips of hard mask (mask H) intersect HM1 are the location for the bit line contacts. It is at the bit line contact that two adjacent NAND strings will connect to the same bit line.

Figure 11:
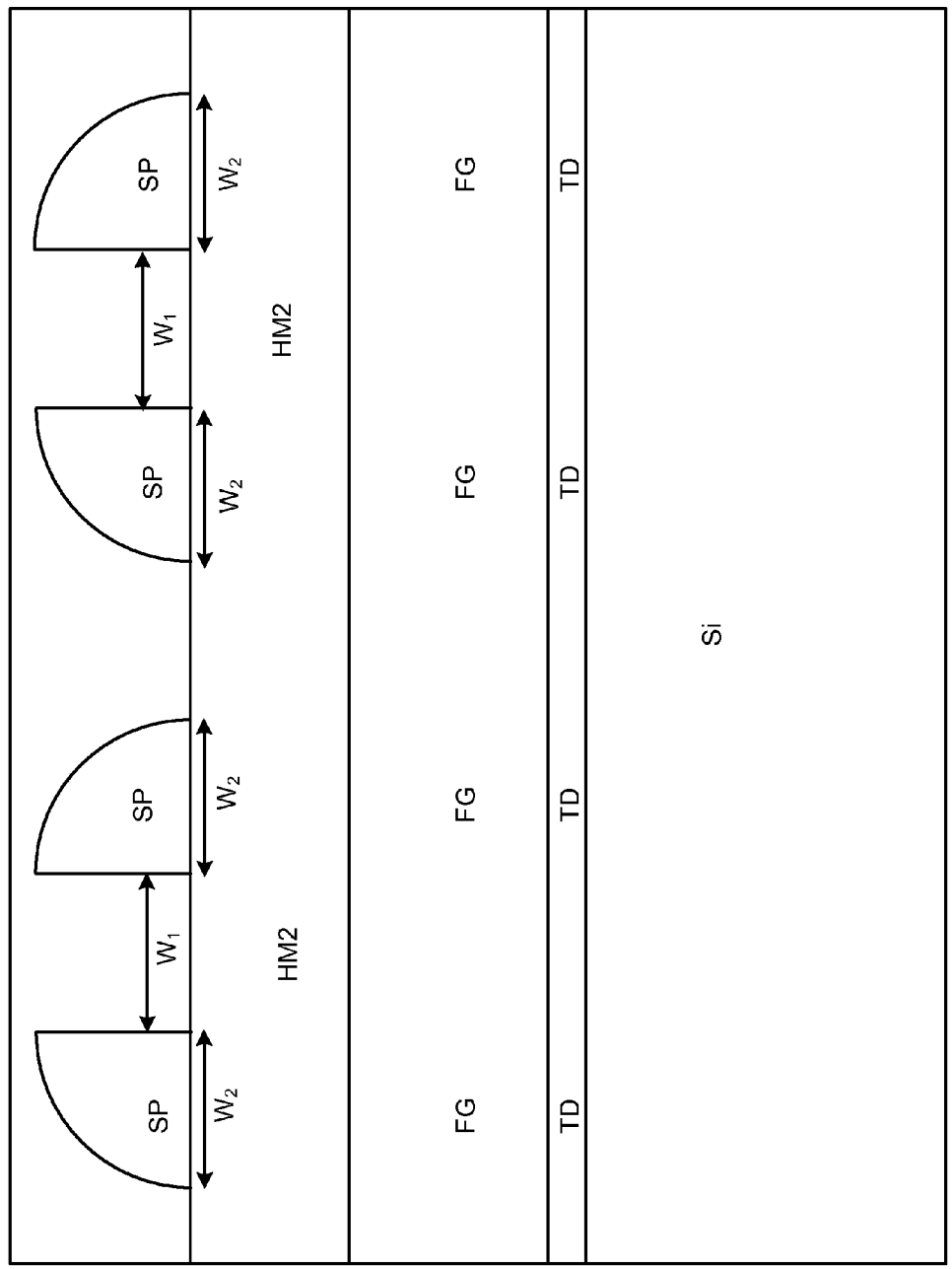
Figure 11A:
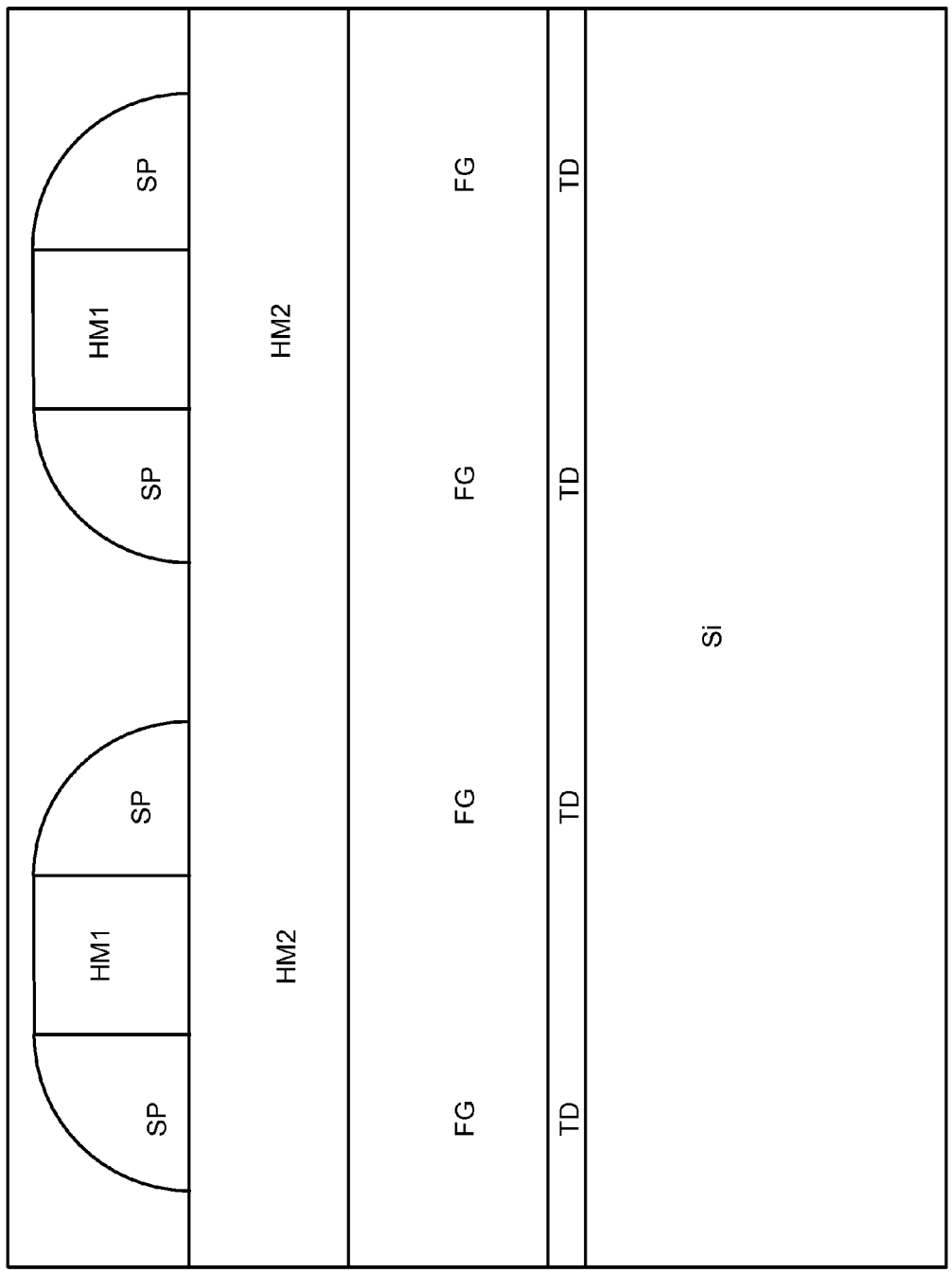
Figure 12:
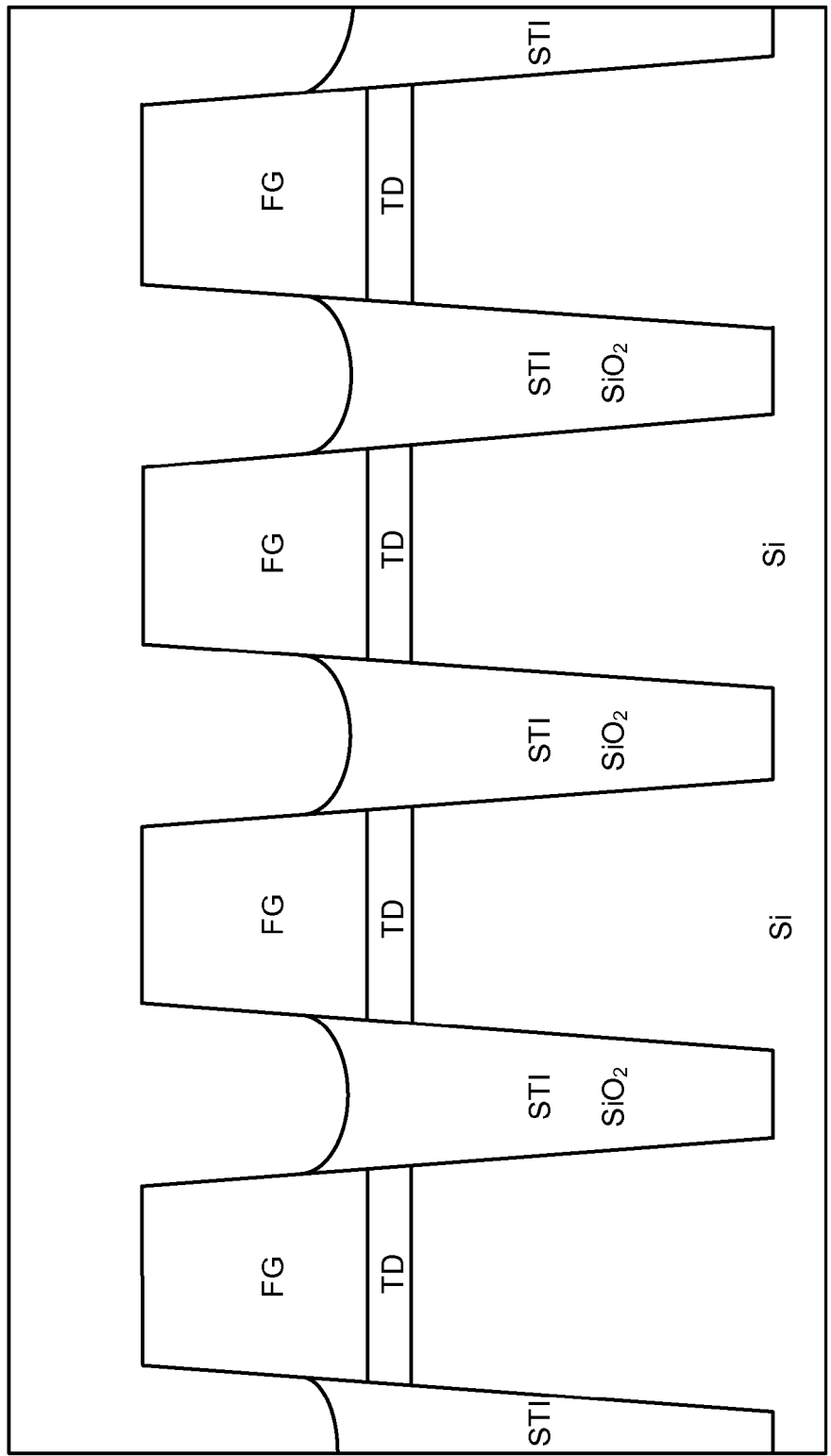
Figure 13:
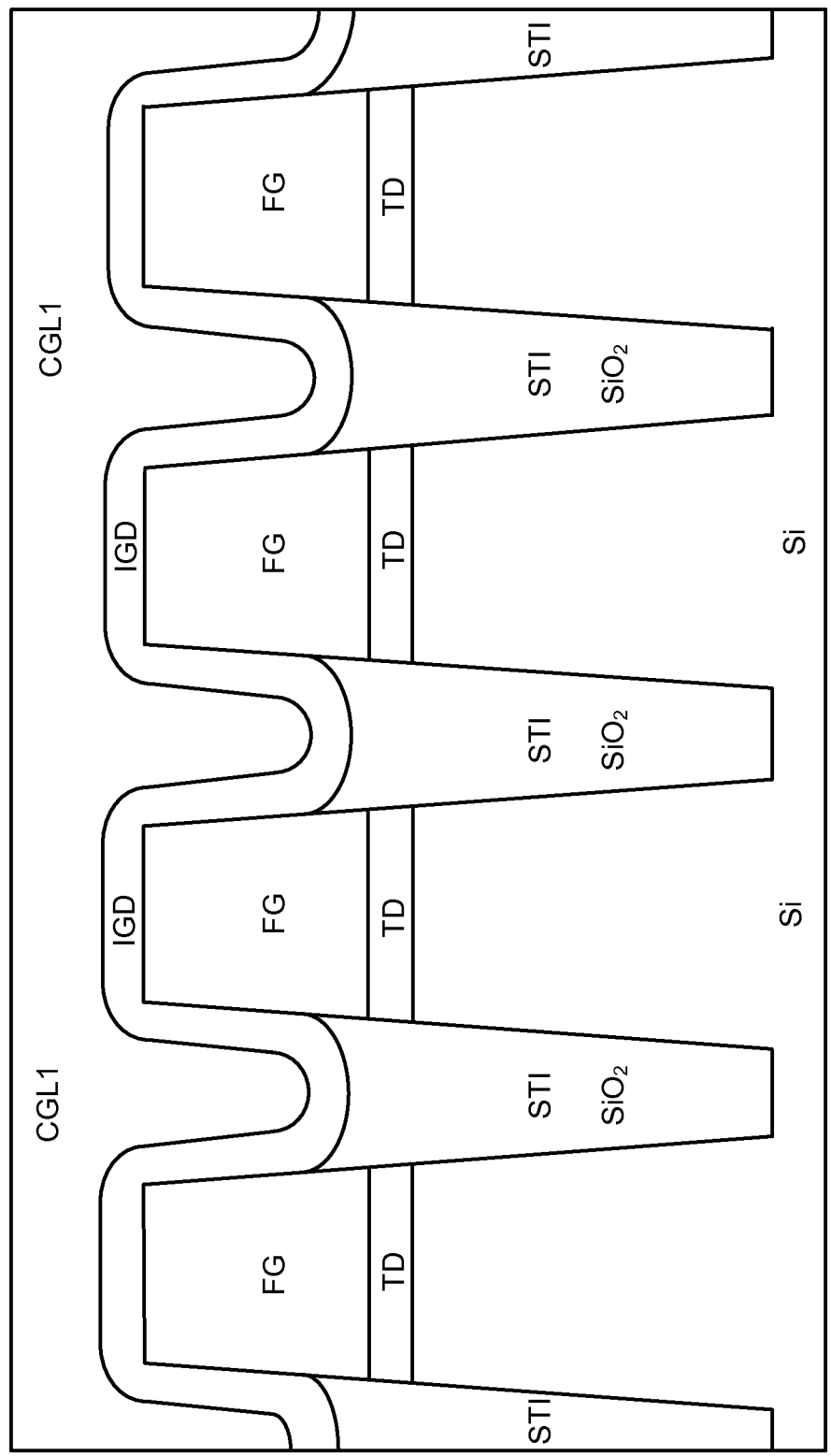

In step 318 of FIG. 6A, the top hard mask HM1 strips are removed using the appropriate wet chemical etch that will remove hard mask strips HM1 but not the spacers SP or mask H. Therefore, the portions of HM1 below mask will not be removed. FIG. 11 depicts the structure after step 318 in a location that is not under mask H so that HM1 was removed. FIG. 11A depicts the structure after step 318 in a location that is under mask H so that HM1 was not removed. In step 319, horizontal strips of hard mask (mask H) are removed. In step 320, a Reactive Ion Etch (RIE) will be used to etch between spacers, through the bottom hard mask HM2, through the floating gate layer, through the tunnel dielectric layer and into the silicon to form shallow trench isolation (STI) areas between spacers. The STI areas are inside the silicon area Si. In step 322, the spacers are removed using any suitable process known in the art. In step 324, the STI areas are filled with oxide. In step 325, the oxide is polished using a chemical mechanical polish process (CMP). In step 326, the bottom hard mask layer is removed using a wet chemical etch (e.g., using $H_3PO_4$). In step 328, the oxide is etched back to remove the oxide down to a level near the top of the tunnel oxide layer TD. The result of step 328 is depicted in FIG. 12, which shows the oxide in the STI up to a level that is a little above tunnel dielectric layer TD. In step 330, the inter-gate dielectric layer is deposited using, for example ALD or CVD process. The inter-gate dielectric layer can be formed by using materials such as $SiO_2$, ONO, $HfO_2$, $Al_2O_3$ or any other high-k material(s) (e.g., not just limited to these), or any combination of such materials. In step 332, a first control gate layer (CGL1) is deposited. In one embodiment, the floating gate layer FG and the first control gate layer CGL1 are both made of polysilicon. The results of step 332 are depicted in FIG. 13 which shows inter-gate dielectric layer IGD and the first control gate layer CGL1. After step 332, the process continues at step 334 FIG. 6B.

Figure 14:
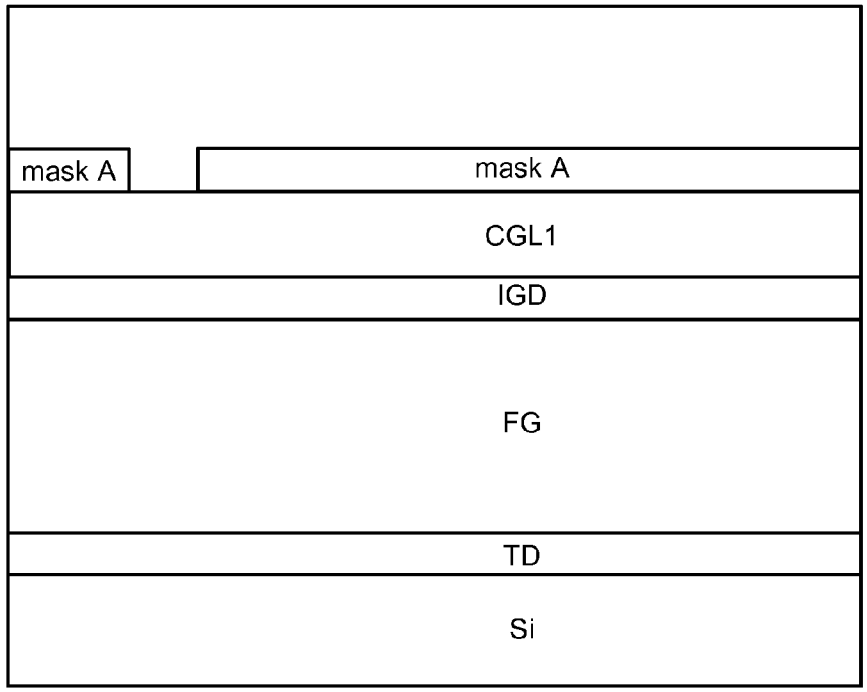
Figure 15:
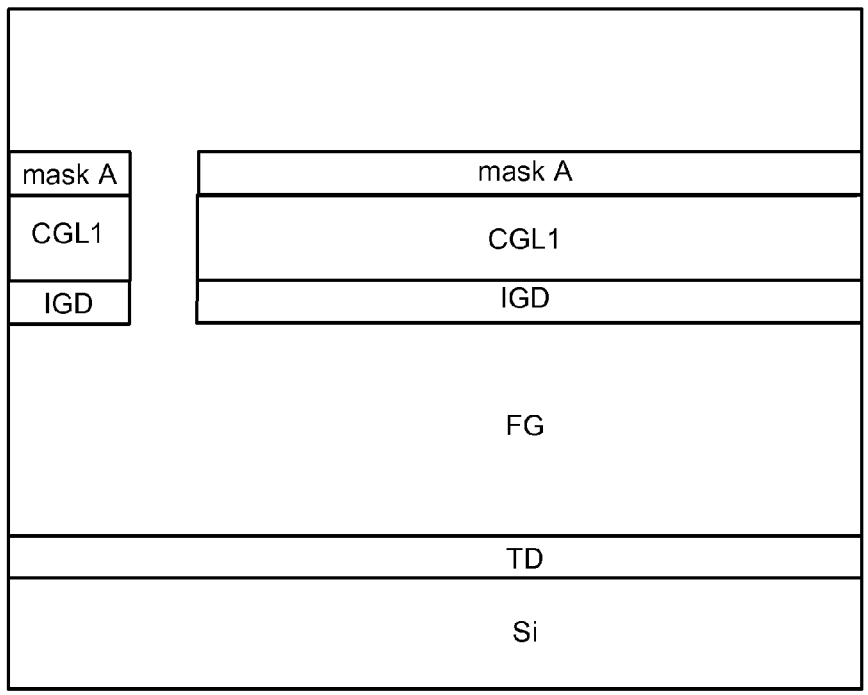

In step 334 of FIG. 6B, a mask is deposited and patterned. The mask is referred to in the drawings as Mask A. The purpose of the mask is to selectively create shorts (via an aperture or passageway in the inter-gate dielectric IGD) within the drain side select gates of the NAND strings. This mask also creates shorts (via an aperture or passageway in the inter-gate dielectric IGD) within the source side select gates of the NAND strings. These shorts are not created in the memory cells used for storing data. Thus, the mask will have an opening where there should be a passageway from control gate layer 1 CGL1 to floating gate layer FG through inter-gate dielectric IGD. The results of step 334 are depicted in FIG. 14 which shows Mask A deposited above control gate layer 1

GGL1. Note that FIG. 14 is in a different perspective than FIGS. 7-13. As discussed above, FIG. 14 shows a perspective along line BB of FIG. 4.

Figure 16:
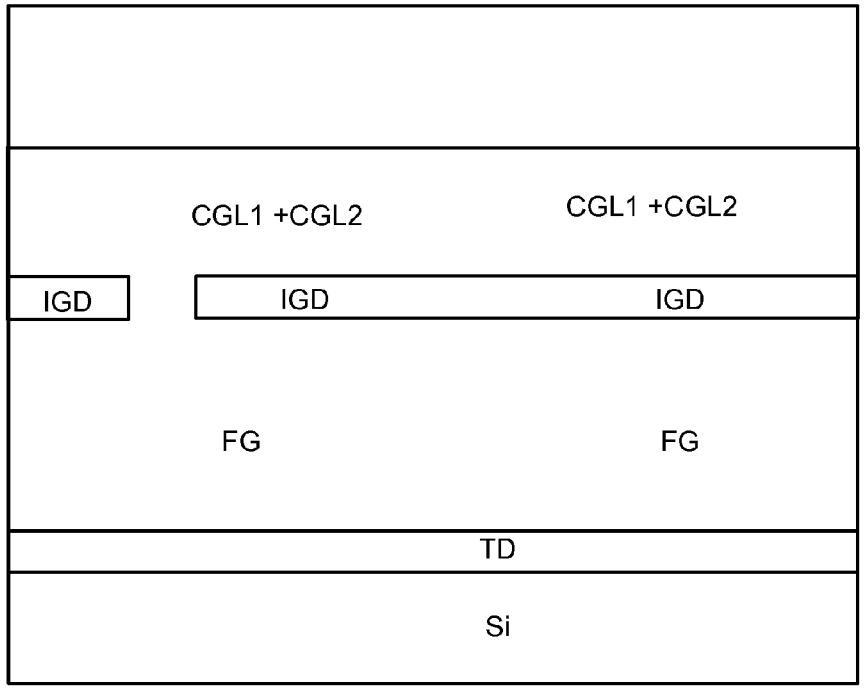

In step 336 of FIG. 6B, an etching process will be performed using RIE to etch through CGL1 and IGD, as well as a little bit into floating gate layer FG. As can be seen from FIG. 15, the etching is performed in the gaps of Mask A and a passageway is created from CGL1 through IGD to FG. In step 338, Mask A is removed using any suitable process known in the art. In step 340, a second control gate layer is deposited. The second control gate layer is depicted in FIG. 16 as CGL2. Thus, CGL1 and CGL2 together form the control gate. When second control gate layer CGL2 is deposited, it will fill in the passageway created during step 336 so that the control gate layer (CGL1+CGL2) will be in electrical communication (and in electrical contact) with floating gate layer FG.

In one embodiment, FG, CGL1 and CGL2 will be made of the polysilicon. Other materials can also be used. In another embodiment, the three layers FG, CGL1 and CGL2 can be made of different materials from each other. When floating gate layer FG, control gate layer 1 CGL1 and control gate layer CGL2 are all made of conductive materials, and the control gate and floating gate are shorted together, the selection gate will not operate as a non-volatile memory cell.

Figure 17:
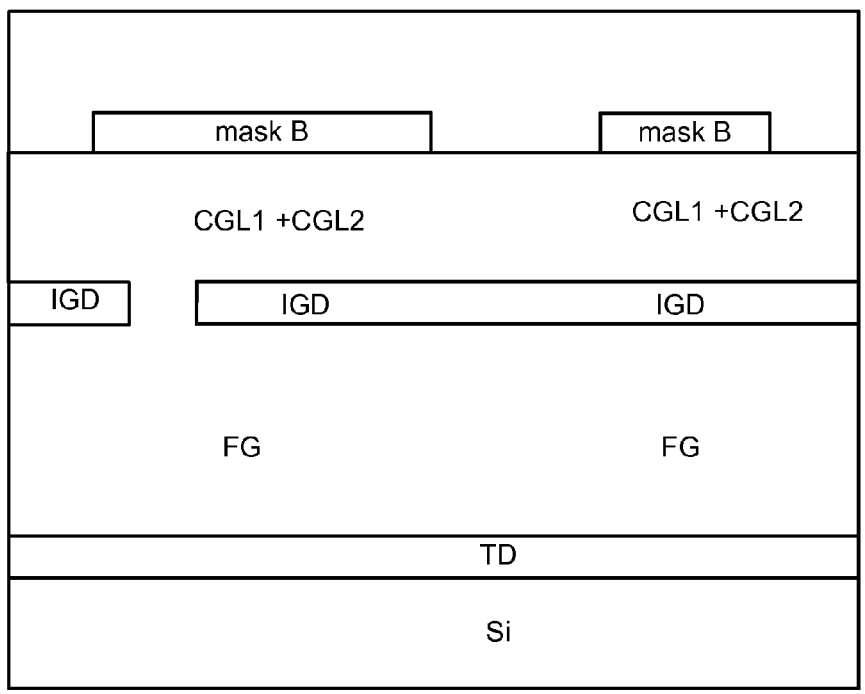
Figure 18:
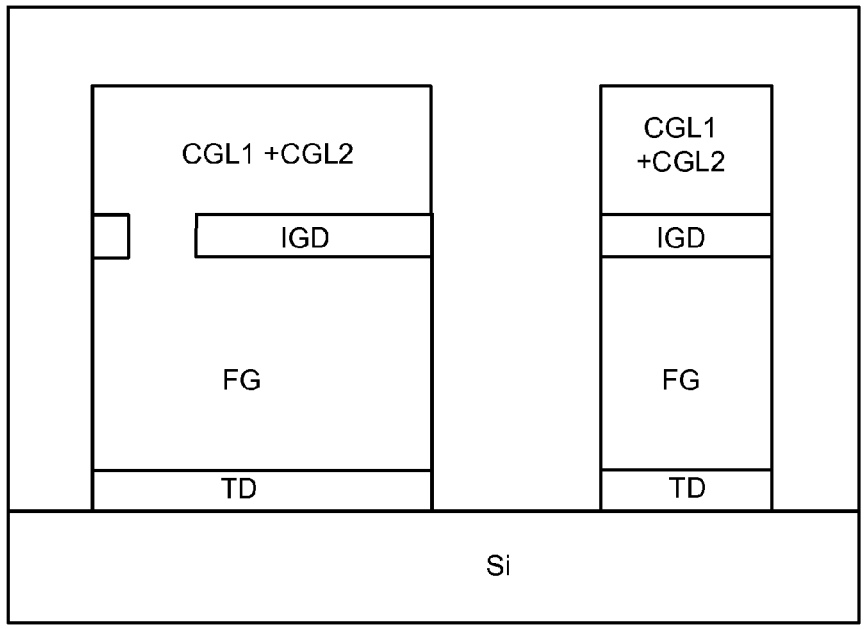

In step 342, another mask is patterned. This mask is referred to in the drawings as Mask B. The purpose of Mask B is to define the word lines. FIG. 17 shows the results of step 342 with Mask B deposited over the structure depicted in FIGS. 14-17. In FIG. 18, an etching process (e.g. RIE) is performed down to the substrate. Therefore, the etching process will remove portions of CGL1+CGL2, IGD, FG and TD. This step will break up the strips of active area of a NAND string into separate memory cells and also will divide CGL1+CGL2 into separate word lines. The control gate layer for a memory cell is the same material as a portion of the word line. In step 346, Mask B is removed. The results at step 346 are depicted in FIG. 18. As can be seen, above the silicon Si are two gate stacks. The gate stack on the right includes CGL1+CGL2, IGD, FG and TD. This stack is one of the memory cells (e.g. dummy memory cell or data memory cell connected to the end word line). The stack on the left includes CGL1+CGL2, IGD, FG and TD (with CGL1+CGL2 in communication with FG through a passageway that runs through IGD), and corresponds to the selection gate.

Figure 19:
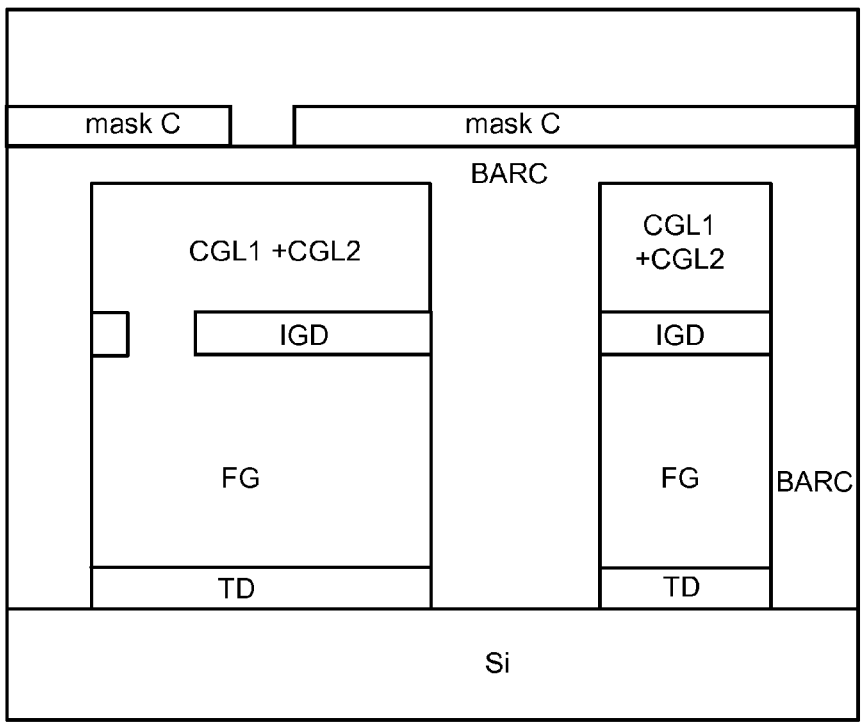

In step 348, BARC (Bottom Anti-Reflective Coating) is added to fill the gaps, and another mask will be deposited and patterned. This mask is referred to as Mask C in the drawings. The purpose of this Mask C is to define the two selection lines SGDO and SGDE. The results of step 348 as depicted in FIG. 19, which shows Mask C deposited on top of the structure of FIG. 18.

Figure 20:
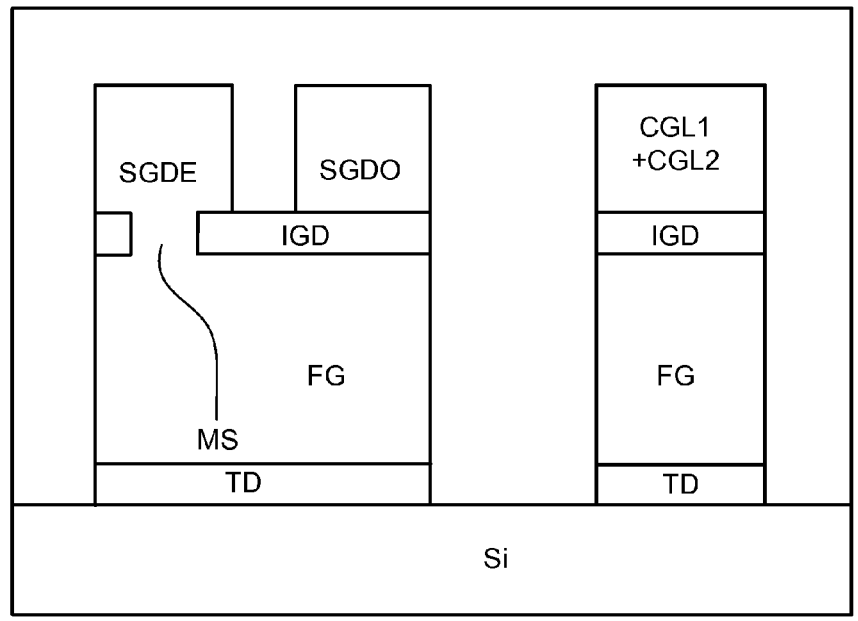

In step 350, an etching process using RIE will be performed to etch through the appropriate portions of CGL1+CGL2 (and BARC) down to inter-gate dielectric layer IGD. In step 352, Mask C and the BARC will be removed. The results of step 352 are depicted in FIG. 20. As can be seen, the layer of CGL1+CGL2 for the selection gate has been cut into two sections: one is a section that corresponds to SGDE and the other section corresponds to SGDO. In this embodiment, SGDE is an electrical contact and communication with floating gate layer FG through the passageway MS. SGDO is electrically insulated from floating gate layer FG by inter-gate dielectric layer IGD.

Figure 21:
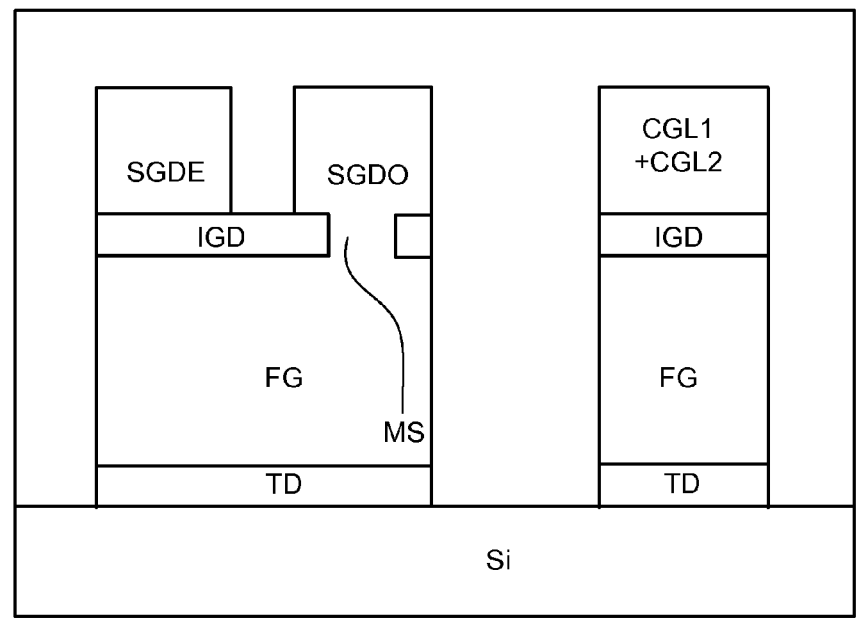

Looking back at FIG. 4, it's noted that every other NAND string will be connected electrically to either SGDE or SGDO. Thus, the selection transistor of FIG. 20 corresponds to selection transistor 220 of FIG. 4. FIG. 21 shows the structure of selection transistor 222 of FIG. 4. In this case, the shape of Mask A (steps 334-338, in FIGS. 14-15) is patterned so that passageway MS is on the other side of IGD; therefore, SGDO is an electrical connection and communication with floating gate layer FG while SGDE is electrically insulated from floating gate layer FG by inter-gate dielectric IGD.

In step 354 of FIG. 6B, the source/drain regions of the NAND string are created using implantation, as performed and known in the art. The source/drain regions can also be annealed, as known in the art. In step 356, the bit line contacts are created. In step 358, an insulator is added between SGDE and SGDO. In one embodiment, the insulator is $SiO_2$. In another embodiment, SiN, SiO/SiN combination or Air-gap formation can be used. In step 360, the appropriate metal and signal lines are added to the memory. In step 362, additional processing is performed to include the relevant support circuits and the necessary devices.

As discussed above, the proposed new structure includes neighboring NAND strings connected to a common bit line. Each NAND string will only have one drain side selection gate; however, the control gate layer at each of those drain side select gates are broken up into two regions that are insulated from each other. Only one of those two regions will be in electrical communication and in electrical contact with the floating gate layer via a short (passageway or aperture). Thus, while both control gate layers (and the control gate layers form part of the selection lines) will be in physical contact with the selection transistor, only one of those two control gate regions will be an electrical contact and in electrical communication with the floating gate regions FG. By using only one selection transistor, space can be saved. Because less bit lines are used, less bit line contacts can be used which will reduce memory array size.

FIG. 22A provides a top perspective of a portion of the structure of FIG. 4. For example, FIG. 22A shows the contact for bit line 200 and the contact for bit line 202, as well as the selection signal lines SGDE and SGDO. FIG. 22A shows the active areas AA for the four NAND strings 210, 212, 214 and 216, as well as the floating gate regions FG that correspond to the floating gate regions FG depicted in FIGS. 20 and 21. FIG. 22A also shows the passageway or aperture MS.

Figure 22B:
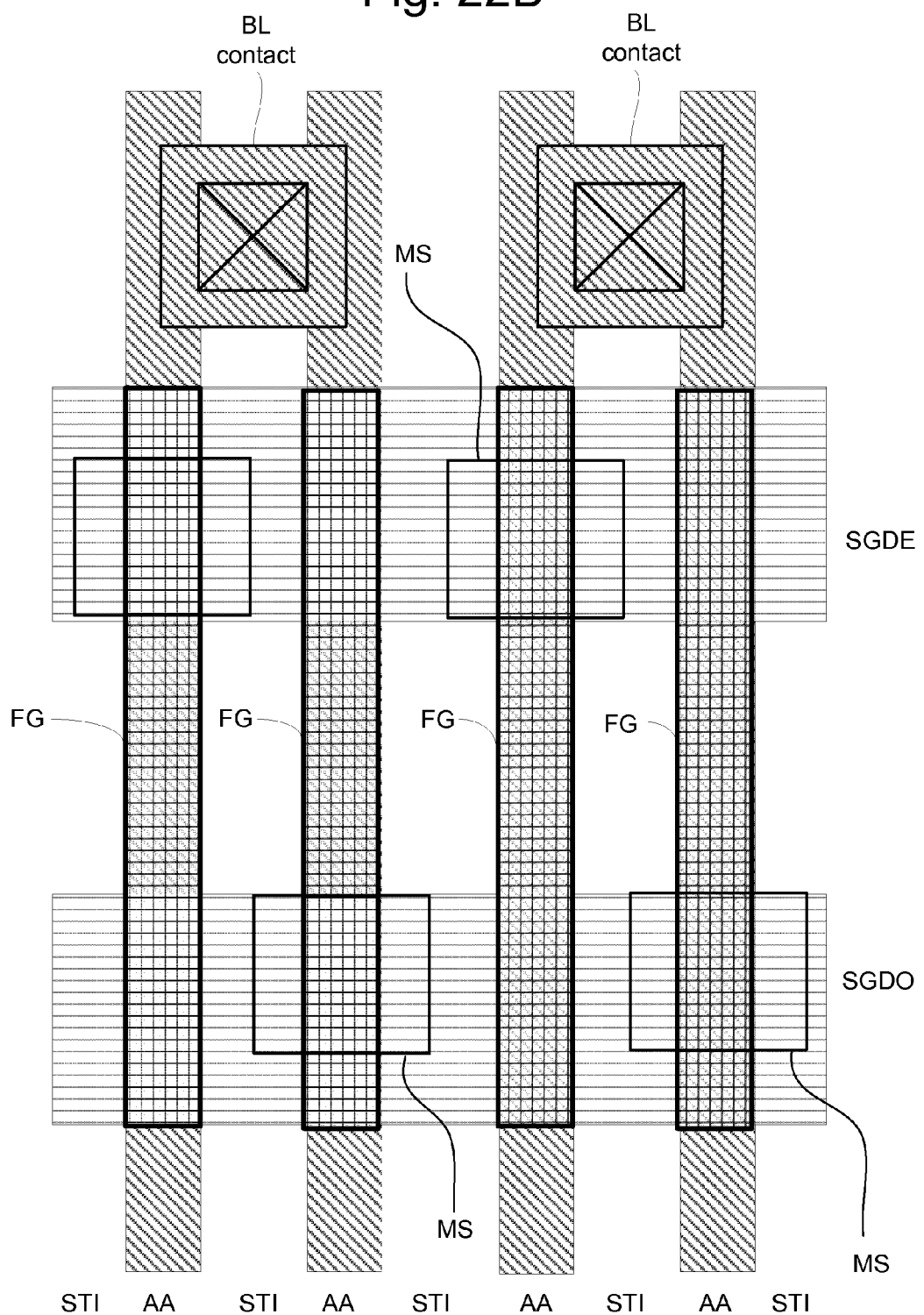
Figure 22C:
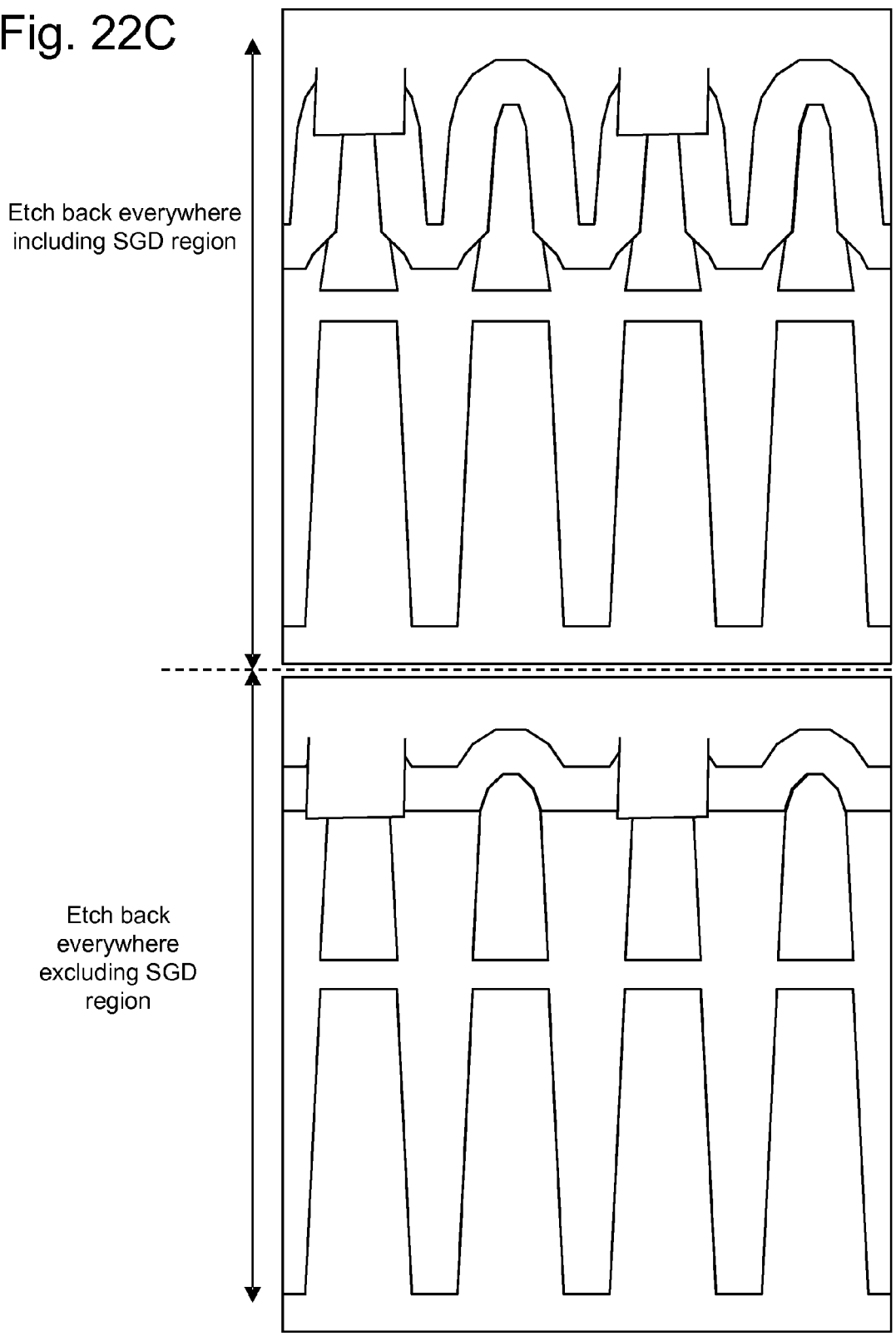
FIG. 22C shows a cross section across multiple NAND strings.

FIG. 22B shows another embodiment of the structure of FIG. 4. Here the etch back step of 328 is performed around the memory cells but is not performed or reduced around the drain side select gate such that the oxide that fills the STI region is at a higher level around the drain side select gate transistor area, thereby, reducing the overlay margins between the edge of the passageway MS and the appropriate control gate portion (SGDO or SGDE). That is, the passageway MS could be at the edge of the control gate region rather than in the middle (as depicted in FIG. 20). Not etching back in the select gate drain regions will help with bringing MS to the edge or beyond the edge of the control gate in the region between SGDE and SGDO, but is not a requirement. Another advantage of not etching back is that not etching back reduces the capacitance between the signal line and the floating gates of odd SGD transistors that do not connect to SGDE. The same holds true for SGDO signal line as well. Another advantage of not etching back is reducing the capacitance between the SGDO signal line and the SGDE signal line. This is illustrated in FIG. 22C which shows a cross section across multiple NAND strings, with the top cross section showing the case of the etch back being performed to the drain side selection gate and the bottom cross section showing the drain side selection gate without the etch back as discussed above.

FIG. 22D depicts another embodiment of the structure of FIG. 4. When etching in step 350, it may be possible to etch the signal lines SGDE and SGDO narrower in the case when the etching process can selectively etch CGL1 and CGL2, without etching FG. In one example, this can be performed by having CGL1 and CGL2 comprise a first conductive material and the FG layer comprise a different conductive material (rather than have CGL1, CGL2 and FG be of the same conductive material as described above).

Figure 22E:
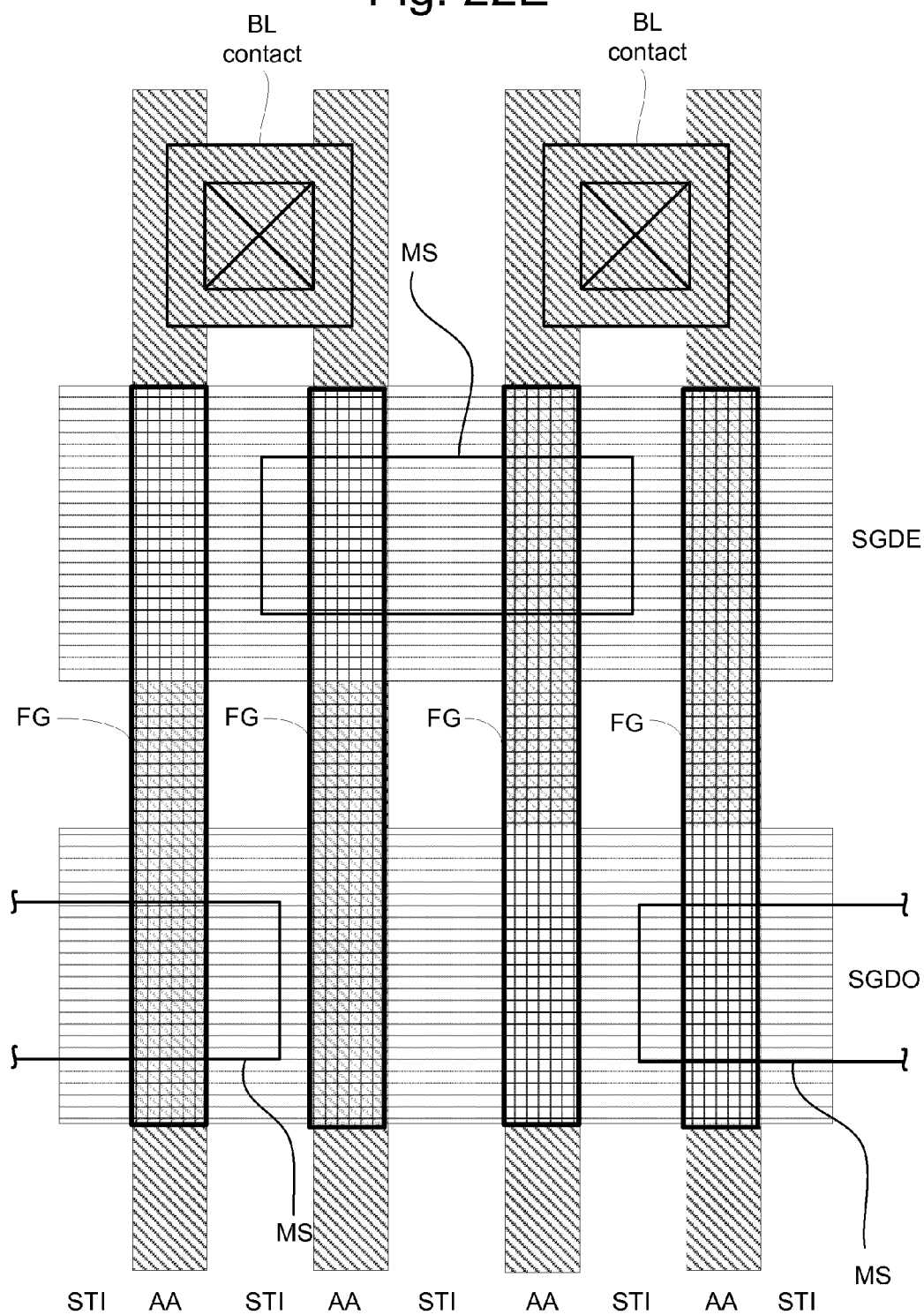

FIG. 22E is a top view of a portion of the structure of FIG. 5. FIG. 22F is a top view of a portion of the structure of FIG. 5 for an embodiment in which the etch back step of 328 is not performed or is reduced around the drain side select gate such that the oxide that fills the STI region is at a higher level around the drain side select gate, thereby, reducing the overlay margins between the edge of the passageway MS and the appropriate control gate portion (SGDO or SGDE). FIG. 22G is another embodiment of the structure of FIG. 5 in which the signal lines SGDE and SGDO are etched narrower in the case when the etching process can selectively etch CGL1 and CGL2, without etching FG.

Figure 23:
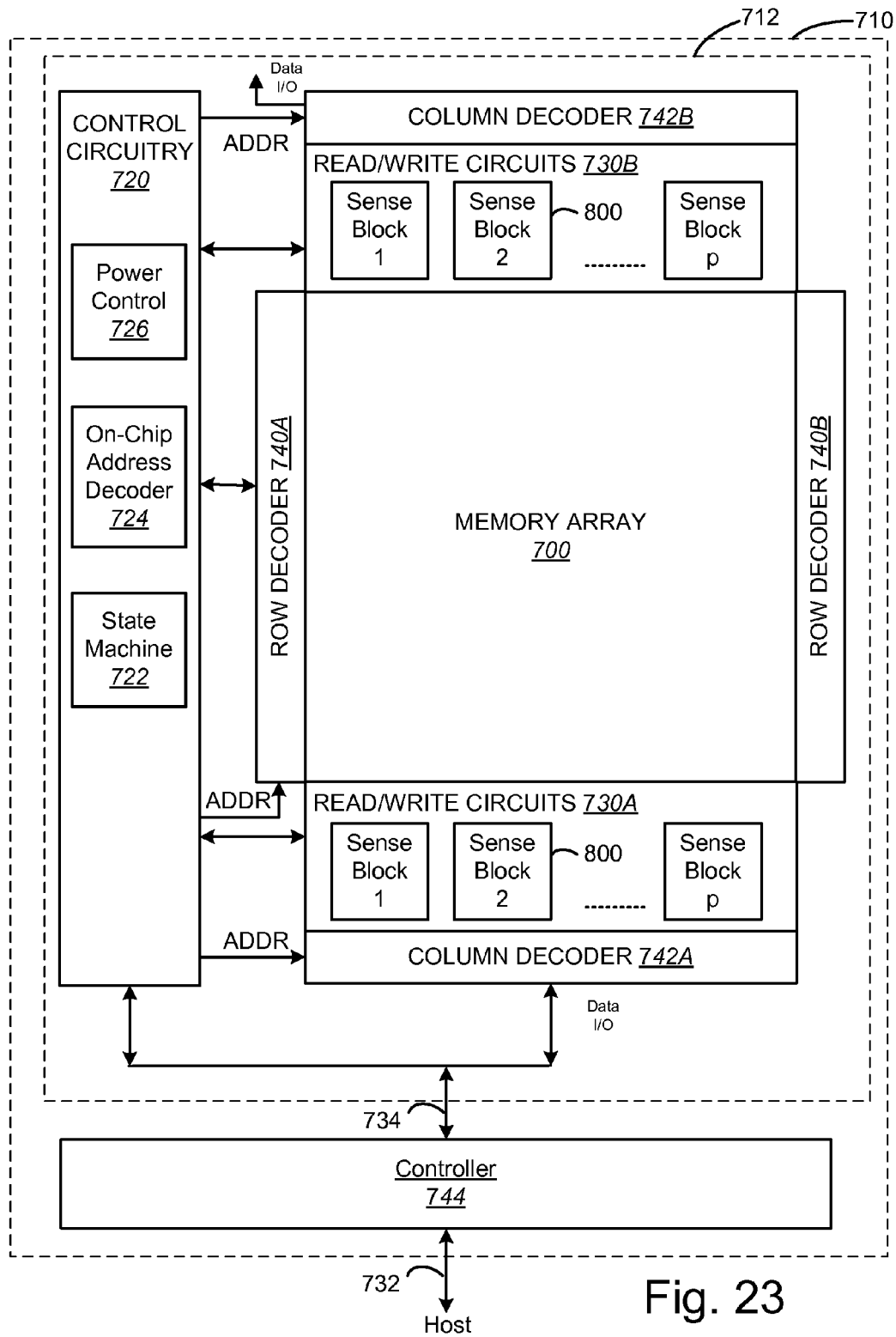
FIG. 23 is a block diagram of a non-volatile memory system.

FIG. 23 illustrates a memory device 710 having read/write circuits for reading and programming a page (or other unit) of memory cells (e.g., NAND multi-state flash memory) in parallel, including memory cells on NAND strings sharing a bit lines as described above. FIG. 23 depicts the Sense Blocks 800, Column decoder 724 and READ/WRITE Circuits 730 on both sides of memory array. With this shared bit line architecture described herein, since the number of sense blocks is halved, one embodiment can include sense blocks, Column decoder and Read/Write circuits on only one side of memory array. This can lead to further reduction of chip size. Memory device 710 may include one or more memory die or chips 712. Memory die 712 includes an array (two-dimensional or three dimensional) of memory cells 700, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 800 which allow a page of memory cells to be read or programmed in parallel. The memory array 700 is addressable by word lines via row decoders 740A and 740B and by bit lines via column decoders 742A and 742B. Word lines and bit lines are examples of control lines. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734.

In another embodiment, the system can include sense blocks, Column decoder and Read/Write circuits on both sides of the array where an array of N NAND strings will have N/2 bit lines, and N/4 bit lines are connected to sense blocks, Column decoder and Read/Write circuits at the top of the array and N/4 bit lines are connected to sense blocks, Column decoder and Read/Write circuits at the bottom of the array.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage.

In one embodiment, one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 can be referred to as one or more managing circuits. The one or more managing circuits perform the processes for erasing, programming and reading.

In one embodiment, an array of memory cells 600 is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

The operation of the structure described above is very similar to the operation of prior art flash memory. For example when reading memory cells, any suitable processing known in the art can be utilized. The deviation from processes known in the art are due to the presence of two select gate signals. If reading memory cells on NAND strings electrically connected to SGDE, then SGDE should be set at a voltage that turns on the selection gate (should use a voltage that is greater than the threshold voltage of selection gate, e.g., three volts) and SGDO should be set at zero volts to cut off those NAND strings that are electrically connected to SGDO. If reading memory cells connected on NAND strings electrically connected to SGDO, then SGDO receives the voltage to turn on the selection gate (e.g. three volts) and SGDE is set at zero volts to cut off the other NAND strings. The rest of the signals operate the same as is known in the art. When performing an erase operation, SGDE, SGDO, SGS, bit lines and source lines are floating. All word lines in a selected block are grounded. The p-well is provided with an appropriate erase voltage. Other erase schemes in the existing art can also be used.

FIG. 24 is a table describing one embodiment of a process for programming using the structure of FIG. 4 or FIG. 5. FIG. 24 shows voltages applied during six successive time periods for the example of programming even NAND stings (and not odd NAND strings) with data that causes NAND string 210 to be programmed and NAND string 214 to be inhibited from being programmed. FIG. 24 shows voltage values for the bit line 200 (BL200), Bit line 202 (BL202), SGDE, SGDO, the selected word line WLn (in this example, is WLn=2), unselected word lines (WLn#2) and the source side selection signal SGS. During time period T1, all signals are at 0 volts. During T2, BL200, BL202, SGDE and SGDO are set at Vdd, while all word lines (WLn=2 and WLn≠2) are at Vpass (e.g., ~7-10 volts). Various existing boosting schemes which employ application of different voltages on unselected word lines can also be used. SGS remains at 0 v. All NAND strings are pre-charged and boosted during T2. At time T3, SGDO is changed to 0 v, so that odd NAND strings (e.g., NAND strings 212 and 216) are cut off and will retain the boosting charge in the channels of the memory cells. At time T4, even NAND strings (e.g., NAND strings 210 and 214) are selectively unboosted. That is, those NAND strings that are to receive programming (e.g., 210) lose their boosting charge in the channel areas by lowering the bit line voltage to 0 volts, while those NAND strings (e.g., 214) that are not to receive programming will retain their boosting. In some embodiments, SGDE is lowered from Vdd (e.g., 2.6-3v) to Vsgd (e.g., ~2.2 v) to reduce boosting leakage from drain side select gate. At time T5, the programming voltage Vpgm is applied to the selected word line WLn=2 as a voltage pulse. At time T6, the voltages are returned to 0v. In some implementations, the process of FIG. 24 is repeated multiple times during programming of data. In one embodiment, each iteration of the voltages depicted in FIG. 24 (e.g., iterations of T1-T6) will include a voltage pulse for Vpgm that is higher in magnitude than the previous voltage pulse for Vpgm so that the programming voltage is applied as a series of stepped pulses. Between the pulses, verify operations are performed.

FIG. 25 is a table describing one embodiment of a process for programming using the structure of FIG. 4 or FIG. 5. FIG. 25 shows voltages applied during six successive time periods for the example of programming even NAND stings (and not odd NAND strings) with data that causes NAND string 210 to be programmed and NAND string 214 to be inhibited from being programmed. FIG. 25 shows voltage values for BL200, BL202, SGDE, SGDO, WLn=2, WLn≠2 and SGS. During time period T1, all signals are at 0 volts. During T2, BL200, BL202, SGDE and SGDO are set at Vdd, while all word lines (WLN=2 and WLN≠2) are at 0 volts. However, some or all word lines can be at a different voltage condition ($V_1$). SGS remains at 0 v. All NAND strings are pre-charged during T2. At time T3, SGDO is changed to 0v and BL200 is changed to 0v, so that odd NAND strings and even NAND strings that will not be programmed will retain the pre-charge in the channels of the memory cells. At time T4, Vpass is applied to all word lines so that all odd word lines and all even word lines that will not receive programming will be boosted. SGDE is changed to Vsgd. At time T5, the programming voltage Vpgm is applied to the selected word line WLn=2 as a voltage pulse. At time T6, the voltages are returned to 0v. In some implementations, the process of FIG. 25 is repeated multiple times during programming of data. Between the pulses (e.g., between iterations of the process of FIG. 25), verify operations are performed. Boosting later in the process allows for less boosting leakage.

FIG. 26 is a table describing one embodiment of a process for programming using the structure of FIG. 4 or FIG. 5. FIG. 26 shows voltages applied during six successive time periods for the example of programming even NAND stings (and not odd NAND strings) with data that causes NAND string 210 to be programmed and NAND string 214 to be inhibited from being programmed. FIG. 26 shows voltage values BL200, BL202, SGDE, SGDO, WLn=2, WLn≠2 and SGS. During time period T1, all signals are at 0 volts. During T2, BL200, BL202, and SGDO are set at Vdd, while all word lines (WLN=2 and WLN≠2) and SGDE are at 0 volts. However, some or all word lines can be at a different voltage condition ($V_1$). SGS remains at 0v. Odd NAND strings are pre-charged during T2. At time T3, SGDO and BL200 are changed to 0v and SGDE is raised to Vdd so that odd NAND strings retain the pre-charge from T2 and even NAND strings that are to be inhibited are pre-charged in T3. At time T4, all NAND strings received Vpass and SGDE is changed to Vsgd. This allows boosting on all NAND strings that will not receive programming. At time T5, the programming voltage Vpgm is applied to the selected word line WLn=2 as a voltage pulse. At time T6, the voltages are returned to 0v. In some implementations, the process of FIG. 26 is repeated multiple times during programming of data. Between the pulses (e.g., between iterations of the process of FIG. 26), verify operations are performed.

The above embodiments for programming describe various pre-charging schemes for boosting. One problem that could arise for a shared BL that is connected to a programmable NAND string and an inhibited NAND string is that some of the boosted charge in the inhibited NAND string could leak across the channel of the boosted select gate transistor and into the drain side of the select gate drain transistor of inhibited NAND string. To overcome this, it is proposed to perform channel engineering whereby the Boron concentration in the channel of the drain side selection gate is increased towards bit line contact side of the drain selection gate making the channel doping concentration asymmetric.

Figure 27A:
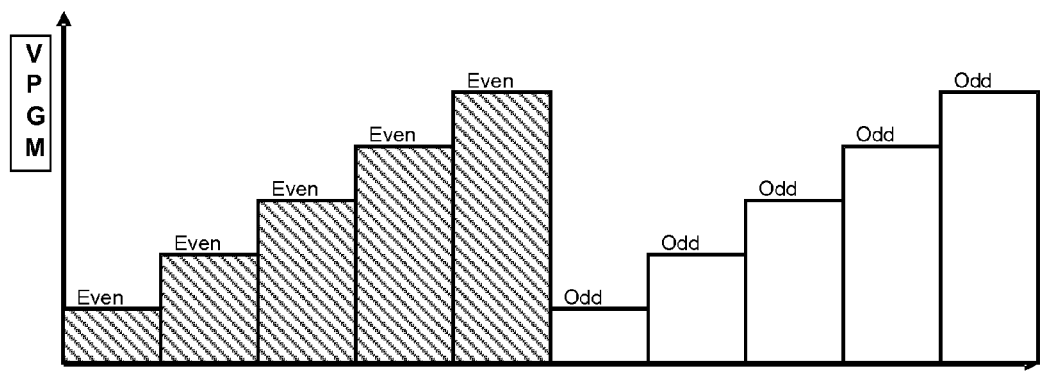
FIG. 27A shows voltage pulses used to program non-volatile storage.
Figure 27B:
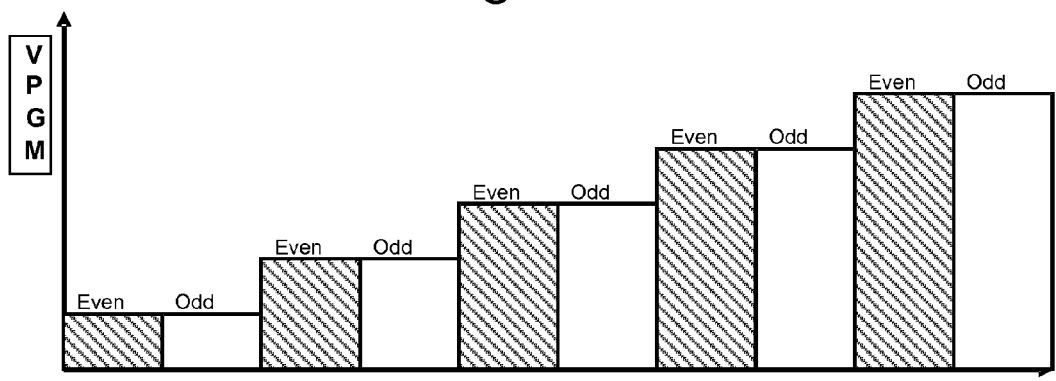
FIG. 27B shows voltage pulses used to program non-volatile storage.

As mentioned above, the program voltage Vpgm is applied as a series of pulses. FIGS. 27A and 27B show two different embodiments of program voltage pulses. For both figures, the shaded pulses program the even NAND strings while inhibiting the odd NAND strings. The unshaded pulses program the odd NAND strings while inhibiting the even NAND strings.

FIG. 27A depicts an embodiment in which first the even NAND strings are programmed (while the odd NAND strings are inhibited from programming) with a set of program pulses have magnitudes that increase for each successive pulse. After the even NAND strings have completed programming, then the odd NAND strings are programmed (while the even NAND strings are inhibited from programming) with a set of program pulses have magnitudes that increase for each successive pulse. In this embodiment, data for even NAND strings are first loaded into data latches and then the even NAND strings are programmed. After the even NAND strings are programmed, then data for odd NAND strings is loaded into data latches and then the odd NAND strings are programmed.

FIG. 27B depicts an embodiment where programming of even NAND strings are interleaved with programming of odd NAND strings. For example, a program pulse for even NAND strings at a first magnitude is applied, followed by a program pulse for odd NAND strings at the first magnitude being applied, followed by a program pulse for even NAND strings at a second magnitude being applied (second magnitude is greater than the first magnitude by a step size), followed by a program pulse for odd NAND strings at the second magnitude being applied, etc. The programming schemes of FIGS. 24, 25 and 26 can be used with the programming pulses of FIG. 27A or 27B, as well as other sets of programming pulses. In the case of the interleaved programming depicted in FIG. 27B, verify operations can be performed after each pair of programming pulses that are at the same programming voltage. In some embodiments, extra latches may be needed to engage interleaved programming. For example, in an embodiment of 2 bits per cell technology, we may add 2 extra latches per sense amplifier (i.e. per bit line) just to accommodate the extra 2 bits of data that are associated with interleaved programming. If coarse/fin programming is to be utilized also, then an additional third latch may also be required. Thus, in some embodiments of coarse/fine programming with 2 bits per memory cell, the number of latches per sense amplifier (or per bit line) grows from 4 to 7. The original set of latches for the non-interleaved case can be denoted as: 1) sense amplifier latch, 2) ADL, 3) BDL, and 4) XDL, where ADL and BDL are data latches for a multi-level (multi-state) information store and XDL is a data latch that is an out buffer or sense amplifier status signal store. The latches needed for interleaved programming can be denoted as: 1) sense amp latch, 2) ADLE, 3) ADLO, 4) BDLE, 5) BDLO, 6) XDLE, and 7) XDLO, where the E and the O at the end of the latch name designate even or odd. Extra latches add to the die size and cost; however, they help improve program speed and help dissipate floating gate to floating gate parasitic capacitance effects. An alternative to adding extra set of latches is to repeatedly transfer data from the controller for even and odd bit lines after each program pulse. This is currently very prohibitive in terms of both the time and energy required for the repeated transfer of same data after each program pulse. If the energy and performance costs associated with repeated data transfers come down in the future through the introductions of new data I/O schemes, then this method may become viable. In yet another embodiment, if and when the data to be written is available on chip (i.e. residing in binary cache pages) then it may be possible to reduce the number of additional latches from 3 to 1 in the example discussed above. This would be made possible by repeatedly re-reading the data of even and odd cells from the binary cache and placing the data onto the latches at a rate of once per program pulse. In such an embodiment the number of latches for 2 bite per memory cell technology may increase from 4 to 5, where the extra latch holds the coarse/fine programming information for interleaved programming.

Figure 28:
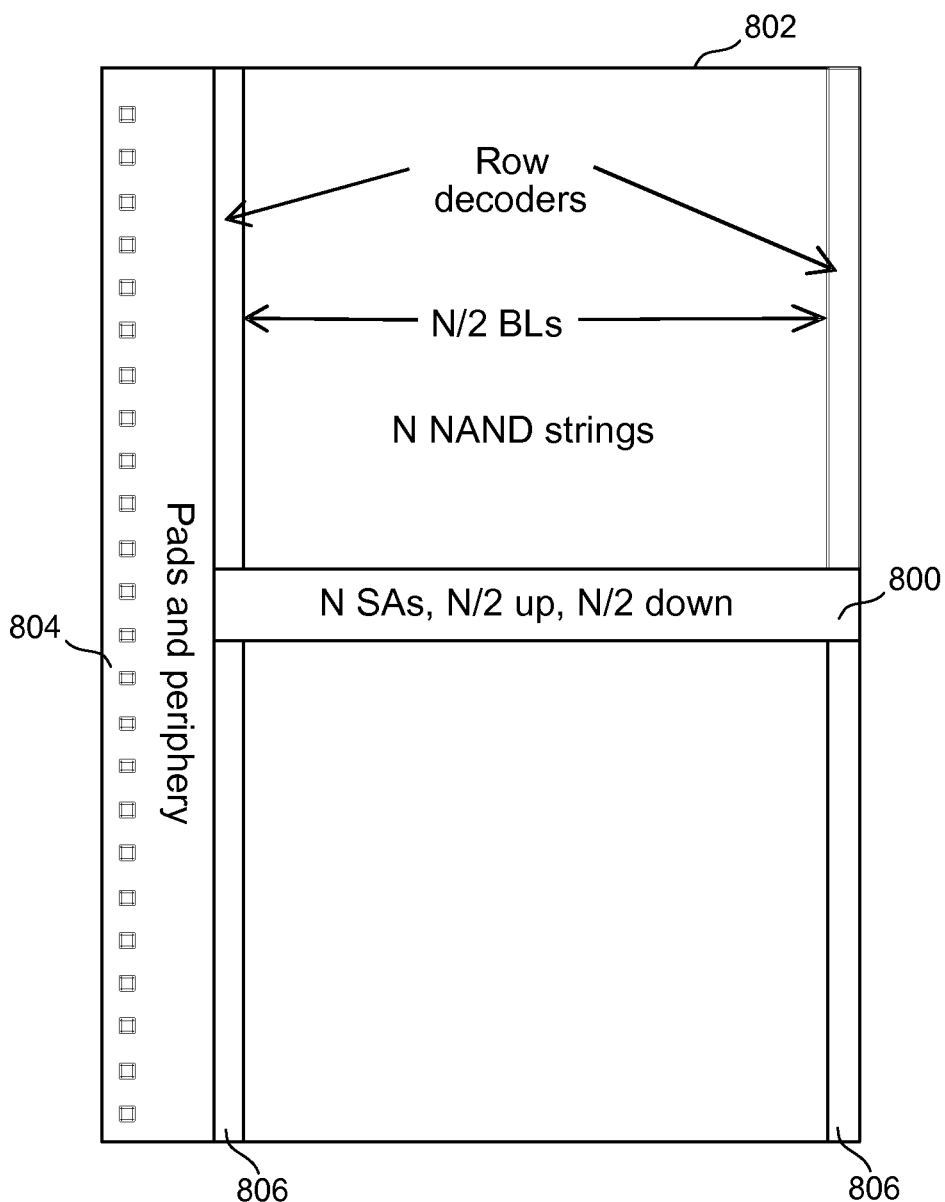
FIG. 28 depicts one embodiment for organizing a memory array and supporting circuitry.

FIG. 28 depicts a memory architecture where the sense amplifiers are placed in the middle of the memory array. For example, FIG. 28 shows the sense amplifiers in middle region 800 of memory array 802. Contact pads and peripheral circuits are depicted in region 804 and row decoders are positioned in areas 806. In one embodiment, half of the sense amplifiers are connected to a plane of blocks of memory cells above and the other half of the sense amplifiers are connected to a plane of blocks of memory cells below the sense amplifiers. The embodiment of FIG. 28 allows for bit line lengths to be decreased by a factor of two. As a result, bit line resistance and capacitance is reduced by factor of two. The bit line RC time constant is reduced by a factor of 4. The embodiment of FIG. 28 has the additional advantage of further reducing the bit line RC time constant by virtue of doubling bit line pitch.

Figure 29:
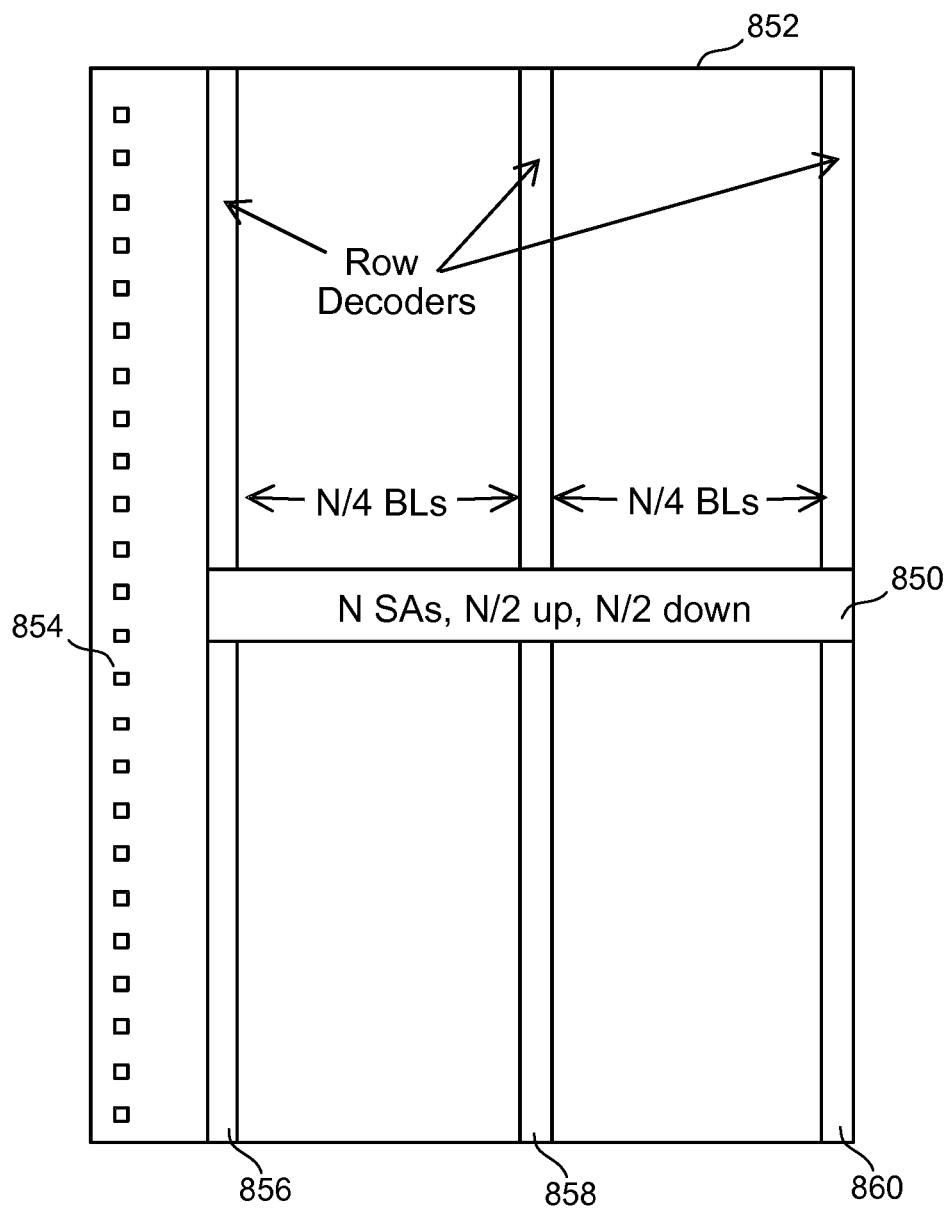
FIG. 29 depicts one embodiment for organizing a memory array and supporting circuitry.

The embodiments described above have one bit line for every pair of NAND strings. This doubles the pitch of the bit lines allowing for further reduction of bit line capacitance, resistance, and/or both, depending on new width and spacing of bit lines. With bit line time constants reduced substantially, further performance gain can be achieved by adding another shared row decoder to make word lines half the usual length and, thereby, reducing word line time constants also by a factor of 4. Such an embodiment is depicted in FIG. 29, which shows sense amplifiers in middle region 850 of memory array 852, contact pads and peripheral circuits are depicted in region 854, and row decoders are positioned in areas 856, 858 and 860. Areas 856 and 860 are on the side of the memory array. Area 858 is in the center of the memory array. This shared row decoder will add to die size, but depending on the application, this added cost may be warranted by the increase in performance.

With no lock out mode (a memory cell locked out from further programming) and faster bit lines, the shared bit line architecture mode provides maximum advantage in terms of energy savings. No lock out allows all bit lines to be charged up simultaneously and also discharged simultaneously. This has a very large impact in saving energy needed to charge and discharge bit lines. The advantage of no lock out or of fewer lock out operations than is typically performed are explained in U.S. Pat. NO. 7,489,553 titled "Non-Volatile Memory With Improved Sensing Having Bit-Line Lockout Control;" U.S. Pat. No. 7,492,640 titled "Sensing With Bit-Line Lockout Control In Non-Volatile Memory;" U.S. Pat. No. 7,808,832 titled "Non-Volatile Memory With Improved Sensing Having Bit-Line Lockout Control," which are all incorporated herein by reference in their entirety.

In the above-described proposals, the drain side selection gate is split into EVEN and ODD on the drain side. However, the dual selection signal architecture can be used on the source side too (or instead of on the drain side). In such an embodiment, there would be two source side selection signals SGSE and SGSO. SGDE and SGSE are connected to even NAND strings. SGDO and SGSO are connected to odd NAND Strings. One potential benefit is that in the embodiments above, the systems reads the even NAND strings first and then the odd NAND strings (or vice versa). When even NAND strings are being read, due to high voltage on unselected WLs (Vread), the memory cells on odd NAND string can get disturbed due to undesired electron injection/ejection. When odd NAND strings are being read, due to high voltage on unselected WLs (Vread), the threshold voltage of memory cells on even NAND string can shift due to undesired electron injection/ejection. By using the split source side selection gate, this undesirable shift of threshold voltage of memory cells on NAND strings not being read can be lowered. When the system reads even NAND strings, SGDE and SGSE are ON (Vsg). But the SGDO and SGSO are off (0V). With the two odd select gates off, the AA (Si) of odd NAND Strings is isolated. When the word lines are driven to VREAD while reading even NAND strings, it will boost the channel of odd NAND strings. As a result, the vertical field seen by odd NAND strings is lowered and undesirable shift of threshold voltage of memory cells on odd NAND strings while reading even NAND strings is mitigated.

One embodiment includes a first bit line, a plurality of word lines, a first selection line, a second selection line, a first NAND string connected to the first bit line and a second NAND string connected to the first bit line. The first NAND string includes a plurality of non-volatile storage elements and a first selection gate. The second NAND string includes a plurality of non-volatile storage elements and a second selection gate. The word lines are connected to the first NAND string and the second NAND string. The first selection gate and the second selection gate each include a substrate layer, a first dielectric layer above the substrate layer, a first conductive layer above the first dielectric layer, a second dielectric layer above the first conductive layer, a second conductive layer above the second dielectric layer, and a third conductive layer that is physically separate from the second conductive layer and above the second dielectric layer. The second dielectric layer of the first selection gate includes a first aperture on a first side of the second dielectric layer that is filled by conductive material that connects the first conductive layer to the second conductive layer The third conductive layer of the first selection gate is electrically insulated from the first conductive layer of the first selection gate. The second dielectric layer of the second selection gate includes a second aperture on a second side of the second dielectric layer that is filled by conductive material that connects the first conductive layer to the third conductive layer. The second conductive layer of the second selection gate is electrically insulated from the first conductive layer of the second selection gate. The second conductive layer of the first selection gate and the second conductive layer of the second conductive gate comprise a portion of the first selection line. The third conductive layer of the first selection gate and the third conductive layer of the second conductive gate comprise a portion of the second selection line.

One embodiment includes a control line, a first selection gate connected to the control line, a first non-volatile storage element connected to the first selection gate and in selective communication with the control line via the first selection gate, a second selection gate connected to the control line, and a second non-volatile storage element connected to the second selection gate and in selective communication with the control line via the second selection gate. The first selection gate includes a first conductive layer, a inter-gate dielectric layer, a second conductive layer and a third conductive layer that is physically separate from the second conductive layer. The inter-gate dielectric layer is between the first conductive layer and the second conductive layer. The inter-gate dielectric layer is between the first conductive layer and the third conductive layer. The inter-gate dielectric layer of the first selection gate includes an aperture that is filled by conductive material that connects the first conductive layer to the second conductive layer. The third conductive layer is electrically insulated from the first conductive layer. The second selection gate includes a first conductive layer, a inter-gate dielectric layer, a second conductive layer and a third conductive layer that is physically separate from the second conductive layer. The inter-gate dielectric layer is between the first conductive layer and the second conductive layer. The inter-gate dielectric layer is between the first conductive layer and the third conductive layer. The inter-gate dielectric layer of the second selection gates includes an aperture that is filled by conductive material that connects the first conductive layer to the third conductive layer. The second conductive layer of the second selection gate is electrically insulated from the first conductive layer of the second selection gate. The second conductive layer of the first selection gate is electrically connected to the second conductive layer of the second selection gate. The third conductive layer of the first selection gate is electrically connected to the third conductive layer of the second selection gate.

One embodiment includes a control line, a first selection gate connected to the control line, a first non-volatile storage element connected to the first selection gate and in selective communication with the control line via the first selection gate, a second selection gate connected to the control line, a second non-volatile storage element connected to the second selection gate and in selective communication with the control line via the second selection gate, a first selection line that physically connects to the first selection gate and the second selection gate, and a second selection line that physically connects to the first selection gate and the second selection gate.

One embodiment includes a process for fabricating non-volatile storage, comprising adding a first dielectric layer over a substrate, a floating gate layer over the dielectric layer and an inter-gate dielectric layer over the floating gate layer and providing for a first passageway through the inter-gate dielectric layer to the floating gate layer; adding a control gate layer, including filling the first passageway with control gate material; removing portions of the floating gate layer, inter-gate dielectric layer and control gate material to define a first selection gate that includes the first passageway; and removing control gate material from the control gate layer to divide the control gate layer to define two selection lines comprising a first selection line and a second selection line. The first selection line is connected to the first passageway thereby putting the first selection line in electrical communication with the floating gate layer for the first selection gate. The second selection line is electrically insulated from the first passageway and the floating gate layer for the first selection gate.

One embodiment includes a control line, a first selection gate connected to the control line (the first selection gate includes a conductive gate), a first non-volatile storage element connected to the first selection gate and in selective communication with the control line via the first selection gate, a first selection line that physically connects to the first selection gate and is electrically connected to the conductive gate, and a second selection line that physically connects to the first selection gate and is electrically insulated from the conductive gate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A non-volatile storage apparatus, comprising:
   a first bit line;
   a plurality of word lines;
   a first selection line;
   a second selection line;
   a first NAND string connected to the first bit line, the first NAND string includes a plurality of non-volatile storage elements and a first selection gate; and
   a second NAND string connected to the first bit line, the second NAND string includes a plurality of non-volatile storage elements and a second selection gate, the word lines are connected to the first NAND string and the second NAND string;
   the first selection gate and the second selection gate each include a substrate layer, a first dielectric layer above the substrate layer, a first conductive layer above the first dielectric layer, a second dielectric layer above the first conductive layer, a second conductive layer above the second dielectric layer, and a third conductive layer that is physically separate from the second conductive layer and above the second dielectric layer;
   the second dielectric layer of the first selection gate includes a first aperture on a first side of the second dielectric layer that is filled by conductive material that connects the first conductive layer to the second conductive layer, the third conductive layer of the first selection gate is electrically insulated from the first conductive layer of the first selection gate;

the second dielectric layer of the second selection gate includes a second aperture on a second side of the second dielectric layer that is filled by conductive material that connects the first conductive layer to the third conductive layer, the second conductive layer of the second selection gate is electrically insulated from the first conductive layer of the second selection gate;

the second conductive layer of the first selection gate and the second conductive layer of the second conductive gate comprise a portion of the first selection line; and the third conductive layer of the first selection gate and the third conductive layer of the second conductive gate comprise a portion of the second selection line.

2. The non-volatile storage apparatus of claim 1, wherein:

the first dielectric layer of the first selection gate and the first dielectric layer of the second selection gate comprise polysilicon; and the second conductive layer and the third conductive layer of the first selection gate and the second selection gate comprise polysilicon.

3. A non-volatile storage apparatus, comprising:

a control line;

a first selection gate connected to the control line, the first selection gate includes a first conductive layer, an inter-gate dielectric layer, a second conductive layer and a third conductive layer that is physically separate from the second conductive layer, the inter-gate dielectric layer is between the first conductive layer and the second conductive layer, the inter-gate dielectric layer is between the first conductive layer and the third conductive layer, the inter-gate dielectric layer of the first selection gate includes an aperture that is filled by conductive material that connects the first conductive layer to the second conductive layer, the third conductive layer is electrically insulated from the first conductive layer;

a first non-volatile storage element connected to the first selection gate and in selective communication with the control line via the first selection gate;

a second selection gate connected to the control line, the second selection gate includes a first conductive layer, an inter-gate dielectric layer, a second conductive layer and a third conductive layer that is physically separate from the second conductive layer, the inter-gate dielectric layer is between the first conductive layer and the second conductive layer, the inter-gate dielectric layer is between the first conductive layer and the third conductive layer, the inter-gate dielectric layer of the second selection gate includes an aperture that is filled by conductive material that connects the first conductive layer to the third conductive layer, the second conductive layer of the second selection gate is electrically insulated from the first conductive layer of the second selection gate, the second conductive layer of the first selection gate is electrically connected to the second conductive layer of the second selection gate, the third conductive layer of the first selection gate is electrically connected to the third conductive layer of the second selection gate; and a second non-volatile storage element connected to the second selection gate and in selective communication with the control line via the second selection gate.

4. The non-volatile storage apparatus of claim 3, further comprising:

a word line connected to the first non-volatile storage element and the second non-volatile storage element, the control line is a bit line.

5. The non-volatile storage apparatus of claim 3, wherein:

the first selection gate includes a first conductive layer;

the second selection gate includes a second conductive layer;

a first selection line is electrically connected to the first conductive layer and is insulated from the second conductive layer; and a second selection line is electrically connected to the second conductive layer and is insulated from the first conductive layer.

6. The non-volatile storage apparatus of claim 5, wherein:

the first selection gate includes a first source/drain area, a second source/drain area, a first channel area between the first source/drain area and the second source/drain area, and a first insulation region between the first channel area and the first conductive layer;

the first conductive layer is positioned above the first channel area and between the first source/drain area and the second source/drain area of the first selection gate;

the second selection gate includes a first source/drain area, a second source/drain area, a second channel area between the first source/drain area and the second source/drain area, and a second insulation region between the second channel area and the second conductive layer; and the second conductive layer is positioned above the second channel area and between the first source/drain area and the second source/drain area of the second selection gate.

7. The non-volatile storage apparatus of claim 3, wherein:

the first selection gate includes a first floating gate layer;

the second selection gate includes a second floating gate layer;

a first selection line is electrically connected to the first floating gate layer and insulated from the second floating gate layer; and a second selection line is electrically connected to the second floating gate layer and insulated from the first floating gate layer.

8. The non-volatile storage apparatus of claim 3, wherein:

a first selection line includes the second conductive layer of the first selection gate and the second conductive layer of the second selection gate; and a second selection line includes the third conductive layer of the first selection gate and the third conductive layer of the second selection gate.

9. The non-volatile storage apparatus of claim 3, wherein:

a first selection line is insulated from the first conductive layer of the second selection gate; and a second selection line is insulated from the second conductive layer of the first selection gate.

10. The non-volatile storage apparatus of claim 3, wherein:

the first conductive layer of the first selection gate is polysilicon;

the second conductive layer of the first selection gate is polysilicon;

the third conductive layer of the first selection gate is polysilicon;

the first conductive layer of the second selection gate is polysilicon;

the second conductive layer of the second selection gate is polysilicon; and the third conductive layer of the second selection gate is polysilicon.

11. The non-volatile storage apparatus of claim 3, wherein:
the first selection gate includes a first source/drain area, a second source/drain area, a first channel area between the first source/drain area and the second source/drain area, and a first insulation region between the first channel area and the first conductive layer;
the first conductive layer of the first selection gate is positioned above the first channel area and between the first source/drain area and the second source/drain area of the first selection gate;
the second selection gate includes a first source/drain area, a second source/drain area, a second channel area between the first source/drain area and the second source/drain area, and a second insulation region between the second channel area and the second conductive layer; and
the second conductive layer of the second selection gate is positioned above the second channel area and between the first source/drain area and the second source/drain area of the second selection gate.

12. The non-volatile storage apparatus of claim 3, further comprising:
a first set of additional non-volatile storage elements, the first non-volatile storage element and the first set of additional non-volatile storage elements comprise a first NAND string, the control line is a bit line;
a second set of additional non-volatile storage elements, the second non-volatile storage element and the second set of additional non-volatile storage elements comprise a second NAND string; and
a plurality of word lines connected to the first NAND string and the second NAND string.

13. The non-volatile storage apparatus of claim 12, further comprising:
an additional control line;
a third NAND string that includes a third selection gate connected to the additional control line;
a fourth NAND string that includes a fourth selection gate connected to the additional control line;
wherein:
a first selection line is in electrical communication with the first selection gate and the third selection gate, and electrically insulated from the second selection gate and the fourth selection gate, and
a second selection line is in electrical communication with the second selection gate and the fourth selection gate, and electrically insulated from the first selection gate and the third selection gate.

14. The non-volatile storage apparatus of claim 12, further comprising:
an additional control line;
a third NAND string that includes a third selection gate connected to the additional control line;
a fourth NAND string that includes a fourth selection gate connected to the additional control line;
wherein:
a first selection line is in electrical communication with the first selection gate and the fourth selection gate, and electrically insulated from the second selection gate and the third selection gate, and
a second selection line is in electrical communication with the second selection gate and the third selection gate, and electrically insulated from the first selection gate and the fourth selection gate.

15. A non-volatile storage apparatus, comprising:
a control line;
a first selection gate connected to the control line, the first selection gate includes a conductive gate;
a first non-volatile storage element connected to the first selection gate and in selective communication with the control line via the first selection gate;
a first selection line that is electrically connected to the conductive gate;
a second selection line that is electrically insulated from the conductive gate; and
the first selection gate includes a first conductive layer, an inter-gate dielectric layer, a second conductive layer and a third conductive layer that is physically separate from the second conductive layer, the inter-gate dielectric layer of the first selection gate is between the first conductive layer of the first selection gate and the second conductive layer of the first selection gate, the inter-gate dielectric layer of the first selection gate is between the first conductive layer of the first selection gate and the third conductive layer of the first selection gate, the inter-gate dielectric layer of the first selection gate includes an aperture that is filled by conductive material that connects the first conductive layer of the first selection gate to the second conductive layer of the first selection gate, the third conductive layer of the first selection gate is electrically insulated from the first conductive layer of the first selection gate;
the conductive gate comprises the first conductive layer;
the second conductive layer is in communication with the first selection line; and
the third conductive layer is in communication with the second selection line.

16. The non-volatile storage apparatus of claim 15, wherein:
the first selection gate includes a first source/drain area, a second source/drain area, a first channel area between the first source/drain area and the second source/drain area, and a first insulation region between the first channel area and the first conductive layer;
the conductive gate is positioned above the first channel area and between the first source/drain area and the second source/drain area of the first selection gate.

17. A non-volatile storage apparatus, comprising:
the non-volatile storage apparatus includes a plurality of NAND strings arranged in three-dimensions;
a first bit line;
a plurality of word lines;
a first selection line;
a second selection line;
a first NAND string of the plurality of NAND strings connected to the first bit line, the first NAND string includes a plurality of non-volatile storage elements and a first selection gate; and
a second NAND string of the plurality of NAND strings connected to the first bit line, the second NAND string includes a plurality of non-volatile storage elements and a second selection gate, the word lines are connected to the first NAND string and the second NAND string;
the first selection gate and the second selection gate each include a substrate layer, a first dielectric layer above the substrate layer, a first conductive layer above the first dielectric layer, a second dielectric layer above the first conductive layer, a second conductive layer above the second dielectric layer, and a third conductive layer that is physically separate from the second conductive layer and above the second dielectric layer;

the second dielectric layer of the first selection gate includes a first aperture on a first side of the second dielectric layer that is filled by conductive material that connects the first conductive layer to the second conductive layer, the third conductive layer of the first selection gate is electrically insulated from the first conductive layer of the first selection gate;

the second dielectric layer of the second selection gate includes a second aperture on a second side of the second dielectric layer that is filled by conductive material that connects the first conductive layer to the third conductive layer, the second conductive layer of the second selection gate is electrically insulated from the first conductive layer of the second selection gate;

the second conductive layer of the first selection gate and the second conductive layer of the second conductive gate comprise a portion of the first selection line; and the third conductive layer of the first selection gate and the third conductive layer of the second conductive gate comprise a portion of the second selection line.

18. The non-volatile storage apparatus of claim 17 wherein the non-volatile storage apparatus includes a plurality of NAND strings arranged in three-dimensions further comprises:
the plurality of NAND strings are arranged in a three-dimensional memory structure.

19. The non-volatile storage apparatus of claim 17 wherein the non-volatile storage apparatus includes a plurality of NAND strings arranged in three-dimensions further comprises:
the non-volatile storage apparatus includes a three-dimensional memory array including the plurality of NAND strings.

20. A non-volatile storage apparatus, comprising:
the non-volatile storage apparatus includes a plurality of non-volatile storage elements arranged in three-dimensions;
a control line;
a first selection gate connected to the control line, the first selection gate includes a first conductive layer, an inter-gate dielectric layer, a second conductive layer and a third conductive layer that is physically separate from the second conductive layer, the inter-gate dielectric layer is between the first conductive layer and the second conductive layer, the inter-gate dielectric layer is between the first conductive layer and the third conductive layer, the inter-gate dielectric layer of the first selection gate includes an aperture that is filled by conductive material that connects the first conductive layer to the second conductive layer, the third conductive layer is electrically insulated from the first conductive layer;
a first non-volatile storage element of the plurality of non-volatile storage elements, the first non-volatile storage element connected to the first selection gate and in selective communication with the control line via the first selection gate;
a second selection gate connected to the control line, the second selection gate includes a first conductive layer, an inter-gate dielectric layer, a second conductive layer and a third conductive layer that is physically separate from the second conductive layer, the inter-gate dielectric layer is between the first conductive layer and the second conductive layer, the inter-gate dielectric layer is between the first conductive layer and the third conductive layer, the inter-gate dielectric layer of the second selection gate includes an aperture that is filled by conductive material that connects the first conductive layer to the third conductive layer, the second conductive layer of the second selection gate is electrically insulated from the first conductive layer of the second selection gate, the second conductive layer of the first selection gate is electrically connected to the second conductive layer of the second selection gate, the third conductive layer of the first selection gate is electrically connected to the third conductive layer of the second selection gate; and
a second non-volatile storage element of the plurality of non-volatile storage elements, the second non-volatile storage element connected to the second selection gate and in selective communication with the control line via the second selection gate.

21. The non-volatile storage apparatus of claim 20 wherein the non-volatile storage apparatus includes a plurality of non-volatile storage elements arranged in three-dimensions further comprises:
the plurality of non-volatile storage elements are arranged in a three-dimensional memory structure.

22. The non-volatile storage apparatus of claim 20 wherein the non-volatile storage apparatus includes a plurality of non-volatile storage elements arranged in three-dimensions further comprises:
the non-volatile storage apparatus includes a three-dimensional memory array including the plurality of non-volatile storage elements.

23. A non-volatile storage apparatus, comprising:
the non-volatile storage apparatus comprises a plurality of non-volatile storage elements arranged in three dimensions;
a control line;
a first selection gate connected to the control line, the first selection gate includes a conductive gate;
a first non-volatile storage element of the plurality of non-volatile storage elements connected to the first selection gate and in selective communication with the control line via the first selection gate;
a first selection line that is electrically connected to the conductive gate;
a second selection line that is electrically insulated from the conductive gate; and
the first selection gate includes a first conductive layer, an inter-gate dielectric layer, a second conductive layer and a third conductive layer that is physically separate from the second conductive layer, the inter-gate dielectric layer of the first selection gate is between the first conductive layer of the first selection gate and the second conductive layer of the first selection gate, the inter-gate dielectric layer of the first selection gate is between the first conductive layer of the first selection gate and the third conductive layer of the first selection gate, the inter-gate dielectric layer of the first selection gate includes an aperture that is filled by conductive material that connects the first conductive layer of the first selection gate to the second conductive layer of the first selection gate, the third conductive layer of the first selection gate is electrically insulated from the first conductive layer of the first selection gate;
the conductive gate comprises the first conductive layer;
the second conductive layer is in communication with the first selection line; and
the third conductive layer is in communication with the second selection line.

24. The non-volatile storage apparatus of claim 23 wherein the non-volatile storage apparatus includes a plurality of non-volatile storage elements arranged in three-dimensions further comprises:

the plurality of non-volatile storage elements are arranged in a three-dimensional memory structure.

25. The non-volatile storage apparatus of claim 23 wherein the non-volatile storage apparatus includes a plurality of non-volatile storage elements arranged in three-dimensions further comprises:
  the non-volatile storage apparatus includes a three-dimensional memory array including the plurality of non-volatile storage elements.

* * * * *